(12) United States Patent
Lee et al.

(10) Patent No.: US 9,568,798 B2
(45) Date of Patent: Feb. 14, 2017

(54) LIQUID CRYSTAL DISPLAY

(71) Applicant: Samsung Display Co., Ltd, Yongin, Gyeonggi-Do (KR)

(72) Inventors: Chang-Hun Lee, Hwaseong-si (KR); Keun Chan Oh, Cheonan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 15/074,604

(22) Filed: Mar. 18, 2016

(65) Prior Publication Data
US 2016/0202521 A1    Jul. 14, 2016

Related U.S. Application Data

(62) Division of application No. 14/481,330, filed on Sep. 9, 2014, now Pat. No. 9,331,102.

(30) Foreign Application Priority Data

Jan. 15, 2014   (KR) ........................ 10-2014-0005312

(51) Int. Cl.
*H01L 27/14*    (2006.01)
*G02F 1/1368*   (2006.01)
(Continued)

(52) U.S. Cl.
CPC ....... *G02F 1/1368* (2013.01); *G02F 1/133345* (2013.01); *G02F 1/134363* (2013.01);
(Continued)

(58) Field of Classification Search
CPC .............. G02F 1/1368; G02F 1/133345; G02F 1/133514; G02F 1/133512; G02F 1/134336; G02F 1/136286; G02F 1/1336; G02F 1/133308; H01L 27/124; H01L 29/7869; H01L 27/1225; H01L 27/1259; H01L 27/326; H01L 29/78633

See application file for complete search history.

(56) References Cited

U.S. PATENT DOCUMENTS 7,339,644 B2   3/2008  Arai et al.
7,453,530 B2   11/2008 Paik et al.
(Continued)

FOREIGN PATENT DOCUMENTS

JP      2005215455 A    8/2005
KR   1020080039614 A    5/2008
(Continued)

*Primary Examiner* — Cuong Q Nguyen
*Assistant Examiner* — Nishath Yasmeen
(74) *Attorney, Agent, or Firm* — Cantor Colburn, LLP

(57) ABSTRACT

A liquid crystal display includes: a first substrate; a gate line on the first substrate; a gate insulating layer on the gate line; a semiconductor layer on the gate insulating layer; a data line and a drain electrode on the semiconductor layer; a passivation layer covering the data line and the drain electrode; a common electrode on the passivation layer; an interlayer insulating layer on the common electrode; a pixel electrode on the interlayer insulating layer; an additional insulating layer on the pixel electrode; a second substrate opposite to the first substrate; and a black matrix on the second substrate, and including a vertical portion covering the data line and a horizontal portion covering the gate line and the drain electrode, where an empty portion is defined through the additional insulating layer in a portion corresponding to the black matrix.

11 Claims, 25 Drawing Sheets

(51) Int. Cl.
*H01L 27/12* (2006.01)
*G02F 1/1333* (2006.01)
*G02F 1/1343* (2006.01)
*G02F 1/1335* (2006.01)

(52) U.S. Cl.
CPC ...... *H01L 27/124* (2013.01); *G02F 1/133512* (2013.01); *G02F 2001/134372* (2013.01)

(56) References Cited

U.S. PATENT DOCUMENTS

| | | | |
|---|---|---|---|
| 7,599,015 B2* | 10/2009 | Lee | G02F 1/136286 349/43 |
| 8,465,995 B2* | 6/2013 | Jung | H01L 27/088 438/158 |
| 2011/0199565 A1* | 8/2011 | Kunimatsu | G02F 1/133723 349/123 |
| 2012/0127415 A1 | 5/2012 | Ishikawa et al. | |

FOREIGN PATENT DOCUMENTS

| | | |
|---|---|---|
| KR | 1020090053565 A | 5/2009 |
| KR | 1020130067824 A | 6/2013 |

* cited by examiner (a)

slightly recognized (b)

clearly recognized (c)

hardly recognized

LIQUID CRYSTAL DISPLAY

This application is a divisional of U.S. patent application Ser. No. 14/481,330, filed on Sep. 9, 2014, which claims priority to Korean Patent Application No. 10-2014-0005312 filed on Jan. 15, 2014, and all the benefits accruing therefrom under 35 U.S.C. §119, the content of which in its entirety is herein incorporated by reference.

BACKGROUND (a) Field

Exemplary embodiments of the invention relate to a liquid crystal display.

(b) Description of the Related Art

A liquid crystal display, which is one of the most widely used types of flat panel display, displays an image by adjusting the amount of transmitted light by applying a voltage to an electrode and thereby rearranging liquid crystal molecules of a liquid crystal layer.

The liquid crystal display has may be effectively manufactured to be thin, while side visibility may be poor compared to front visibility, and as a result, various methods of arranging and driving liquid crystal have been developed to improve the side visibility. A liquid crystal display, in which a pixel electrode and a common electrode are disposed on a same substrate, may have a wide viewing angle.

SUMMARY

In a liquid crystal display, when optimum common voltages between a white image and a black image are set to be different to improve side visibility, a surface afterimage is generated due to the difference.

Exemplary embodiments of the invention provide a display device with reduced surface afterimage and line afterimage recognized as a surface afterimage by controlling a thickness of a passivation layer in a lower portion of a black matrix and a thickness of a passivation layer in a lower portion of a pixel electrode.

An exemplary embodiment of the invention provides a liquid crystal display, including: a first substrate; a gate line disposed on the first substrate; a gate insulating layer disposed on the gate line; a semiconductor layer disposed on the gate insulating layer; a data line disposed on the semiconductor layer; a drain electrode disposed on the semiconductor layer; a passivation layer which covers the data line and the drain electrode; a common electrode disposed on the passivation layer; an interlayer insulating layer disposed on the common electrode; a pixel electrode disposed on the interlayer insulating layer; an additional insulating layer disposed on the pixel electrode; a second substrate disposed opposite to the first substrate; and a black matrix disposed on the second substrate, where the black matrix includes a vertical portion which covers the data line and a horizontal portion which covers the gate line and the drain electrode, in which the additional insulating layer is disposed in an opening portion exposed through the black matrix, and an empty portion is defined through the additional insulating layer in a light blocking portion corresponding to the black matrix.

In an exemplary embodiment, the liquid crystal display may further include an organic layer disposed on the passivation layer.

In an exemplary embodiment, a thickness of the additional insulating layer may be in a range of about 1,000 angstrom (Å) to about 3,000 Å.

In an exemplary embodiment, a thickness of the interlayer insulating layer corresponding to the vertical portion of the black matrix may be less than a thickness of the interlayer insulating layer in the opening portion.

In an exemplary embodiment, an empty portion may be defined through the interlayer insulating layer in a region corresponding to the vertical portion of the black matrix such that the common electrode in the region corresponding to the vertical portion of the black matrix may be exposed through the additional insulating layer and the interlayer insulating layer.

In an exemplary embodiment, a common electrode opening portion may be defined through the common electrode in the region corresponding to the vertical portion of the black matrix, and an empty portion may be defined through the organic layer in the region corresponding to the vertical portion of the black matrix such that the gate insulating layer may be exposed through the additional insulating layer, the interlayer insulating layer and the organic layer.

In an exemplary embodiment, an empty portion may be defined through the gate insulating layer in the region corresponding to the vertical portion of the black matrix such that the gate line may be exposed through the additional insulating layer, the interlayer insulating layer, the organic layer and the gate insulating layer.

In an exemplary embodiment, a total thickness of the interlayer insulating layer and the additional insulating layer may be greater in the opening portion than in the light blocking portion.

Another exemplary embodiment of the invention provides a liquid crystal display including: a first substrate; a gate line disposed on the first substrate; a gate insulating layer disposed on the gate line; a semiconductor layer disposed on the gate insulating layer; a data line and a drain electrode disposed on the semiconductor layer; a passivation layer which covers the data line and the drain electrode; a common electrode disposed on the passivation layer; an interlayer insulating layer disposed on the common electrode; a pixel electrode disposed on the interlayer insulating layer; a second substrate disposed opposite to the first substrate; and a black matrix disposed on the second substrate, and including a vertical portion which covers the data line and a horizontal portion which covers the gate line and the drain electrode, in which an opening portion is defined in the black matrix by the horizontal portion and the vertical portion of the black matrix, and a thickness of the interlayer insulating layer corresponding to the vertical portion of the black matrix is less than a thickness of the interlayer insulating layer in the opening portion of the black matrix.

In an exemplary embodiment, an empty portion may be defined through the interlayer insulating layer in a region corresponding to the vertical portion of the black matrix such that the common electrode in a region corresponding to the vertical portion of the black matrix may be exposed through the interlayer insulating layer.

In an exemplary embodiment, the liquid crystal display may further include an organic layer disposed on the passivation layer.

In an exemplary embodiment, a common electrode opening portion may be defined through the common electrode in the region corresponding to the vertical portion of the black matrix, and an empty portion may be defined through the organic layer in the region corresponding to the vertical portion of the black matrix such that the gate insulating layer may be defined through the interlayer insulating layer and the organic layer.

In an exemplary embodiment, an empty portion may be defined through the gate insulating layer in the region corresponding to the vertical portion of the black matrix such that the gate line may be exposed through the interlayer insulating layer, the organic layer the gate insulating layer.

In an exemplary embodiment, a thickness of the interlayer insulating layer in the opening portion is greater than a thickness of the interlayer insulating layer in a light blocking portion corresponding to the black matrix.

Yet another exemplary embodiment of the invention provides a liquid crystal display, including: a first substrate; a gate line disposed on the first substrate; a gate insulating layer disposed on the gate line; a semiconductor layer disposed on the gate insulating layer; a data line and a drain electrode disposed on the semiconductor layer; a pixel electrode disposed on the drain electrode; a passivation layer disposed on the pixel electrode; a common electrode disposed on the passivation layer; an additional insulating layer disposed on the common electrode; a second substrate disposed opposite to the first substrate; and a black matrix disposed inside the second substrate, and including a vertical portion which covers the data line and a horizontal portion which covers the gate line and the drain electrode, in which the additional insulating layer is disposed in an opening portion exposed through the black matrix, and an empty portion is defined in the additional insulating layer in a light blocking portion corresponding to the black matrix.

In an exemplary embodiment, a thickness of the additional insulating layer may be in a range of about 1,000 Å to about 3,000 Å.

In an exemplary embodiment, a thickness of the passivation layer in the region corresponding to the vertical portion of the black matrix may be less than a thickness of the passivation layer in the opening portion.

In an exemplary embodiment, an empty portion may be defined through the passivation layer in the region corresponding to the vertical portion of the black matrix such that the data line in the region corresponding to the vertical portion of the black matrix may be exposed through the passivation layer.

In an exemplary embodiment, a total thickness of the interlayer insulating layer and the additional insulating layer may be greater in the opening portion than in the light blocking portion.

Still another exemplary embodiment of the invention provides a liquid crystal display including: a first substrate; a gate line disposed on the first substrate; a gate insulating layer disposed on the gate line; a semiconductor layer disposed on the gate insulating layer; a data line and a drain electrode disposed on the semiconductor layer; a pixel electrode disposed on the drain electrode; a passivation layer disposed on the pixel electrode; a common electrode disposed on the passivation layer; a second substrate disposed opposite to the first substrate; and a black matrix disposed inside the second substrate, and including a vertical portion which covers the data line and a horizontal portion which covers the gate line and the drain electrode, in which a thickness of the passivation layer corresponding to the vertical portion of the black matrix is less than a thickness of the passivation layer in an opening portion exposed through the black matrix.

According to exemplary embodiments of the invention, a thickness of the insulation or passivation layer in the lower portion of the black matrix is less than a thickness of the insulation or passivation layer in the lower portion of the pixel electrode, thereby improving a surface afterimage and a line afterimage recognized as a surface afterimage.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1:
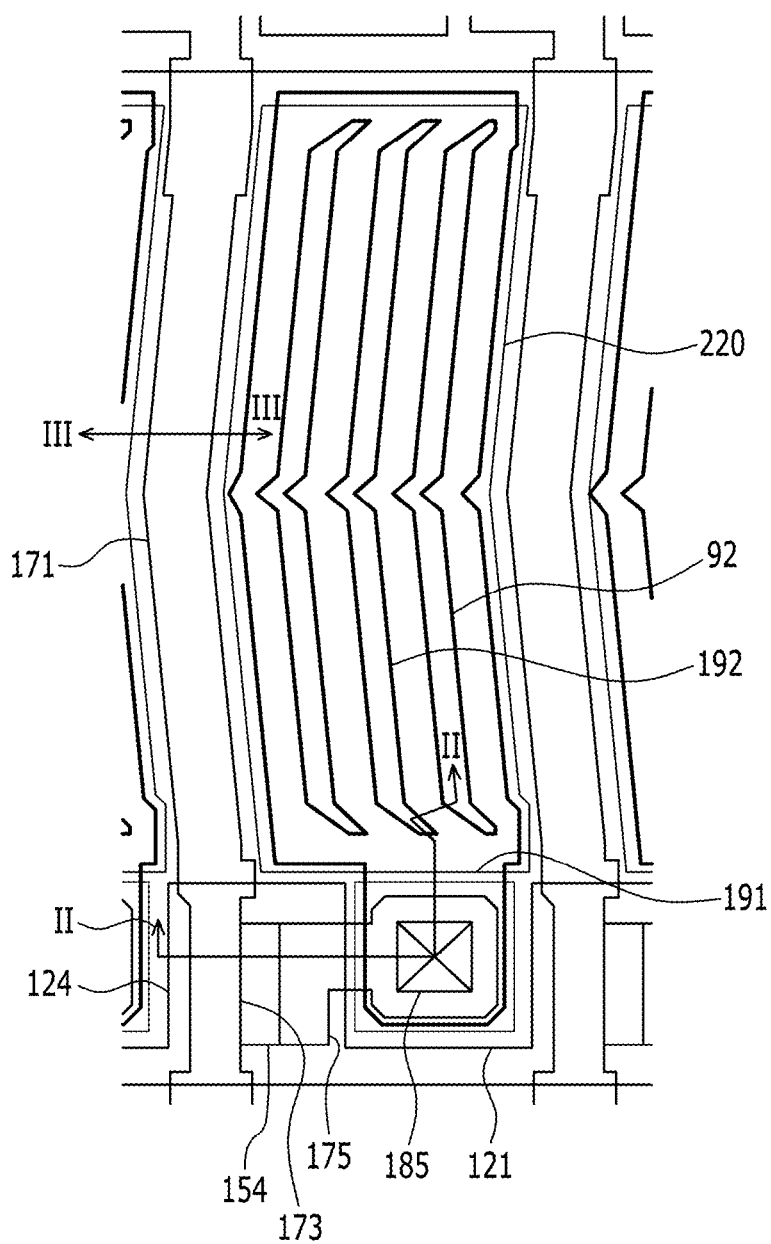
FIG. 1 is a plan view of an exemplary embodiment of a liquid crystal display according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of a liquid crystal display according to the invention will be described in detail with reference to the accompanying drawings.

First, an exemplary embodiment of a liquid crystal display according to the invention will be described with reference to FIGS. 1 to 3.

Figure 2:
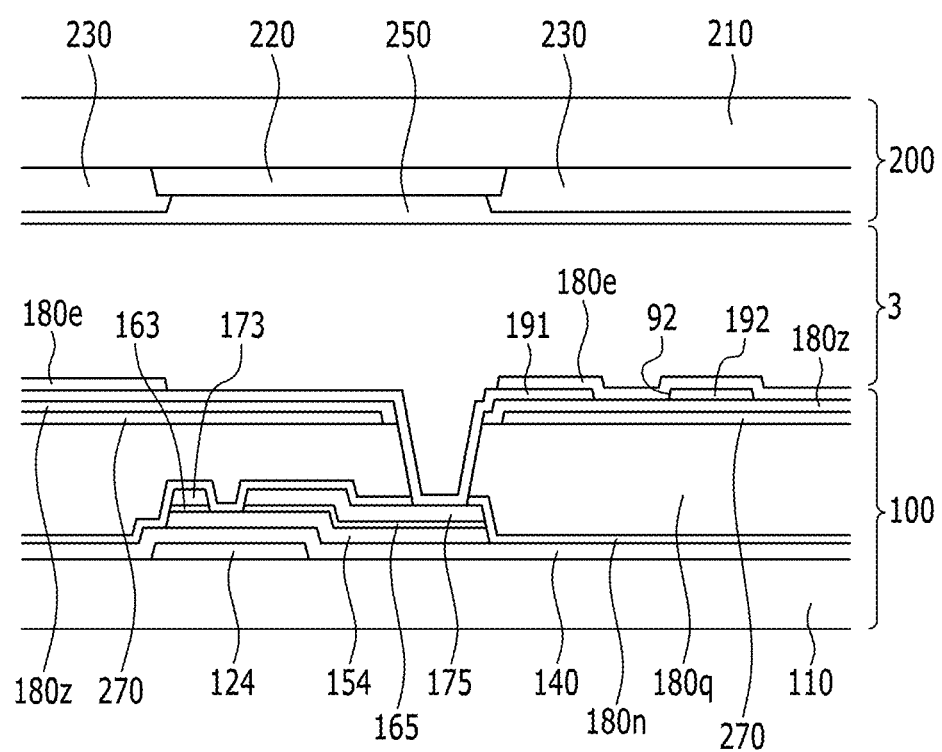
FIG. 2 is a cross-sectional view taken along line II-II of the liquid crystal display illustrated in FIG. 1.

FIG. 1 is a plan view of an exemplary embodiment of a liquid crystal display according to the invention, and FIG. 2 is a cross-sectional view taken along line II-II of the liquid crystal display illustrated in FIG. 1. FIG. 3 is a cross-sectional view taken along line III-III of the liquid crystal display illustrated in FIG. 1.

First, referring to FIGS. 1 and 2, an exemplary embodiment of the liquid crystal display according to the invention includes a lower panel 100 and an upper panel 200, which face each other, and a liquid crystal layer 3 interposed between the lower and upper panels 100 and 200.

First, the lower panel 100 will be described in detail.

The lower panel 100 includes an insulating substrate 110 including a transparent material such as glass, plastic or the like, and a gate conductor including a gate line 121 is disposed on the insulating substrate 110.

The gate line 121 includes a gate electrode 124, and a wide end portion (not illustrated) for connection with another layer or an external driving circuit. The gate line 121 may include an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), tantalum (Ta), or titanium (Ti). In an exemplary embodiment, the gate line 121 may have a multi-layer structure including at least two conductive layers having different physical properties from each other.

A gate insulating layer 140 including silicon nitride (SiNx), silicon oxide (SiOx), or the like is disposed on the gate conductor. The gate insulating layer 140 may have a multi-layer structure including at least two insulating layers having different physical properties from each other.

A semiconductor 154 including amorphous silicon, polysilicon, or the like is disposed on the gate insulating layer 140. The semiconductor 154 may include an oxide semiconductor, for example.

Ohmic contacts 163 and 165 are disposed on the semiconductor 154. The ohmic contacts 163 and 165 may include a material, such as n+ hydrogenated amorphous silicon in which an n-type impurity, such as phosphorus, is doped at a high concentration, or silicide. The ohmic contact 163 and 165 may be disposed on the semiconductor 154 as a pair. In an exemplary embodiment, where the semiconductor 154 includes the oxide semiconductor, the ohmic contacts 163 and 165 may be omitted.

A data conductor including a data line 171, a source electrode 173 and a drain electrode 175 is disposed on the ohmic contacts 163 and 165 and the gate insulating layer 140.

The data line 171 includes a wide end portion (not illustrated) for connection with another layer or an external driving circuit. The data line 171 transfers a data signal and extends substantially in a vertical direction to cross the gate line 121.

In an exemplary embodiment, the data line 171 may have a first bent portion having a bent shape to obtain maximum transmittance of the liquid crystal display, and the bent portions may meet each other in a middle region of a pixel region to form a V-like shape. A second bent portion, which is bent at a predetermined angle with the first bent portion, may be further included in the middle region of the pixel region.

The first bent portion of the data line 171 may be bent at about 7° with respect to a vertical reference line (an imaginary reference line extending in the vertical direction) having 90° with respect to a horizontal direction, in which the gate line 121 extends. The second bent portion disposed in the middle region of the pixel region may be further bent at an angle in a range of about 7° to about 15° with respect to the first bent portion.

The source electrode 173 is defined by a part of the data line 171, and disposed on the same line as the data line 171. The drain electrode 175 extends substantially parallel to the source electrode 173. Accordingly, the drain electrode 175 is substantially parallel to the part of the data lines 171.

The gate electrode 124, the source electrode 173 and the drain electrode 175 collectively define a thin film transistor together with the semiconductor 154, and a channel of the thin film transistor is formed in the semiconductor 154 between the source electrode 173 and drain electrode 175.

In an exemplary embodiment, the liquid crystal display may include the source electrode 173 positioned on the same line as the data line 171 and the drain electrode 175 extending substantially parallel to the data line 171 to increase a width of the thin film transistor without increasing an area occupied by the data conductor, thus increasing an aperture ratio of the liquid crystal display.

The data line 171 and the drain electrode 175 may include a refractory metal, such as molybdenum, chromium, tantalum, and titanium, or an alloy thereof, and may have a multi-layer structure including a refractory metal layer (not illustrated) and a low resistance conductive layer (not illustrated). In an exemplary embodiment, the multi-layer structure of the data line 171 and the drain electrode 175 may include a double layer of a chromium or molybdenum (alloy) lower layer and an aluminum (alloy) upper layer, or a triple layer of a molybdenum (alloy) lower layer, an aluminum (alloy) middle layer and a molybdenum (alloy) upper layer, but not being limited thereto. In an alternative exemplary embodiment, the data line 171 and the drain electrode 175 may have various metals or conductors. In an exemplary embodiment, a width of the data line 171 may be in a range of about 2.75 micrometers (μm) to about 4.25 μm.

A passivation layer 180n is disposed on the data conductors 171, 173 and 175, the gate insulating layer 140, and an exposed portion of the semiconductor 154. The passivation layer 180n may include an organic insulating material, an inorganic insulating material, or the like.

An organic layer 180q is disposed on the passivation layer 180n. The organic layer 180q may be omitted. The organic layer 180q may function as a color filter. In such an embodiment, where the organic layer 180q is a color filter, the organic layer 180q may intrinsically display any one of the primary colors. In an exemplary embodiment, the primary colors may include three primary colors, such as red, green and blue, or yellow, cyan and magenta, or the like. In an exemplary embodiment, the color filter may further include a color filter displaying a mixed color of the primary colors or white in addition to the primary colors.

A common electrode 270 is disposed on the organic layer 180q. The common electrode 270 may have a flat surface and be disposed on an entire surface of the substrate 110 in a planar form. The common electrodes 270 disposed in the adjacent pixels may be connected to each other to receive a common voltage having a predetermined value supplied from the outside of the display region.

An interlayer insulating layer 180z is disposed on the common electrode 270. The interlayer insulating layer 180z may include an organic insulating material, an inorganic insulating material, or the like.

A pixel electrode 191 is disposed on the interlayer insulating layer 180z. The pixel electrode 191 includes a curved edge, which is substantially parallel to the first bent portion and the second bent portion of the data line 171. The pixel electrode 191 includes a plurality of branch electrodes 192, and a plurality of cutouts 92 may be defined in the pixel electrode 191 by the plurality of branch electrodes 192.

A first contact hole 185, through which the drain electrode 175 is exposed, is defined through the passivation layer 180n, the organic layer 180q and the interlayer insulating layer 180z. The pixel electrode 191 is physically and electrically connected to the drain electrode 175 through the first contact hole 185 to receive a voltage from the drain electrode 175.

An additional insulating layer 180e is disposed on the pixel electrode 191 and the interlayer insulating layer 180z. The additional insulating layer 180e may be disposed to cover the entire pixel electrode 191, and an empty portion is defined in the additional insulating layer 180e in a region that overlaps a black matrix 220.

Figure 3:
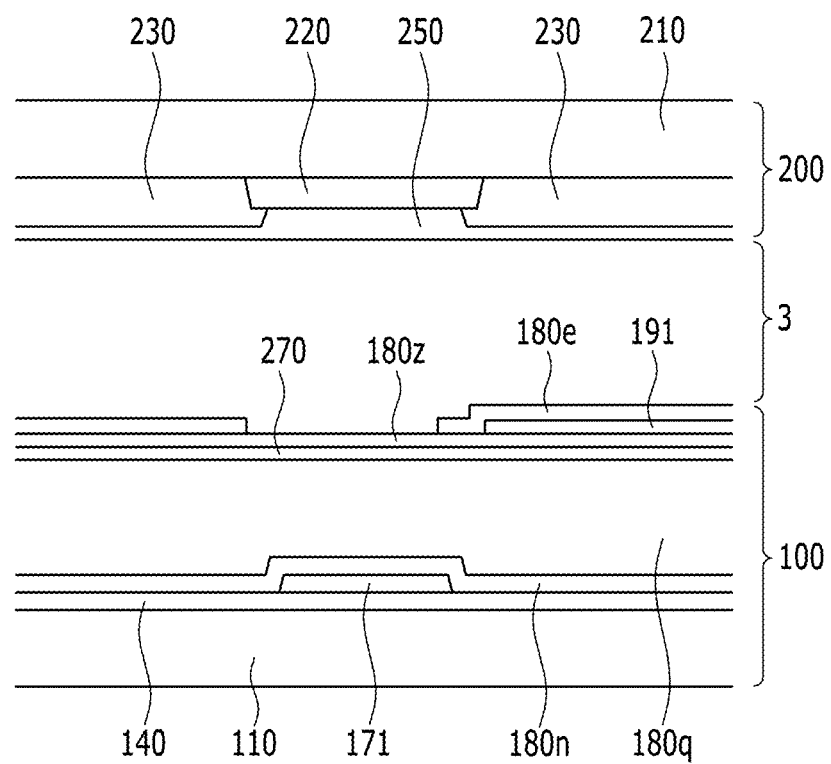
FIG. 3 is a cross-sectional view along line III-III of the liquid crystal display illustrated in FIG. 1 taken.

In an exemplary embodiment, as shown in FIGS. 2 and 3, the black matrix 220 may be disposed on an insulating substrate 210 of the upper panel 200, which includes a transparent material such as glass, plastic, or the like. In an alternative exemplary embodiment, the black matrix 220 may be disposed in the lower panel The black matrix 220 includes a vertical portion overlapping or covering the data line 171 that extends substantially in a vertical direction, and a horizontal portion overlapping or covering the gate line 121 that extends substantially in a horizontal direction to cross the data line 171.

In an exemplary embodiment, the black matrix may have a lattice shape including an opening portion. Herein, a portion overlapping the black matrix in a pixel region is referred to as a light blocking portion, and a portion, which is exposed by the black matrix and in which the pixel electrode and the like are disposed, in the pixel region is referred to an opening portion.

The additional insulating layer 180e may include an organic insulating material, an inorganic insulating material, or the like. In one exemplary embodiment, for example, the additional insulating layer 180e may include silicon nitride (SiNx), silicon oxide (SiOx), or the like.

The empty portion of the additional insulating layer 180e overlaps the black matrix 220. In such an embodiment, the empty portion in the additional insulating layer 180e may be in an upper region of the data line 171 and an upper region of the region in which the gate line 121 and the drain electrode 175. In such an embodiment, the opening portion in the additional insulating layer 180e may overlap the data line 171, the gate line 121 and the drain electrode 175 such that the additional insulating layer 180e may not overlap the data line 171, the gate line 121 and the drain electrode 175.

FIG. 2 is a cross-sectional view of a lower region of the horizontal portion of the black matrix. Referring to FIG. 2, the empty portion of the additional insulating layer 180e is in a region below and overlapping the horizontal portion of the black matrix 220.

FIG. 3 illustrates a cross-section of a lower region of the vertical portion of the black matrix. Referring to FIG. 3, the additional insulating layer 180e is not exist in a region below and overlapping the vertical portion of the black matrix 220.

The additional insulating layer 180e may be provided by applying the additional insulating layer 180e on the entire black matrix 220 and then the empty portion of the additional insulating layer 180e may be provided by selectively etching a portion thereof in a region below and overlapping the black matrix.

A thickness d3 of the additional insulating layer 180e may be in a range of about 1,000 angstrom (Å) to about 3,000 Å. In one exemplary embodiment of the invention, for example, the thickness d3 of the additional insulating layer 180e may be about 2,000 Å.

Hereinafter, the upper panel 200 will be described in detail.

In the upper panel 200, the black matrix is disposed on the insulating substrate 210, including a transparent glass, plastic or the like, to effectively prevent light leakage.

A plurality of color filters 230 is disposed on the substrate 210. In an exemplary embodiment, where the organic layer 180q of the lower panel 100 is a color filter, the color filter 230 of the upper panel 200 may be omitted. In an alternative exemplary embodiment, the light blocking member 220 may be disposed in the lower panel 100.

An overcoat 250 is disposed on the color filter 230 and the light blocking member 220. The overcoat 250 may include an (organic) insulating material, and the overcoat 250 effectively prevents exposure of the color filter 230 and provides a flat surface. In an alternative exemplary embodiment, the overcoat 250 may be omitted.

In an exemplary embodiment, an alignment layer may be disposed on the overcoat 250.

The liquid crystal layer 3 includes a nematic liquid crystal material having positive dielectric anisotropy. The liquid crystal molecules of the liquid crystal layer 3 are arranged in a predetermined direction such that a direction of a longitudinal axes thereof are substantially parallel to the display panels 100 and 200, and the liquid crystal layer has a structure in which the direction of the longitudinal axes thereof are twisted about 90° from a rubbing direction of the alignment layer of the lower panel 100 to the upper panel 200 in a spiral form.

The pixel electrode 191 receives a data voltage from the drain electrode 175, and the common electrode 270 receives a common voltage having a predetermined level from a common voltage application part disposed outside the display region.

The pixel electrode 191 and the common electrode 270, which are field generating electrodes, generate an electric field in the liquid crystal layer 3, such that the liquid crystal molecules of the liquid crystal layer 3 positioned on the two electrodes 191 and 270 are rotated in a direction substantially parallel to a direction of the electric field. In such an embodiment, polarization of light passing through the liquid crystal layer is changed based on the determined rotation direction of the liquid crystal molecules.

Figure 4:
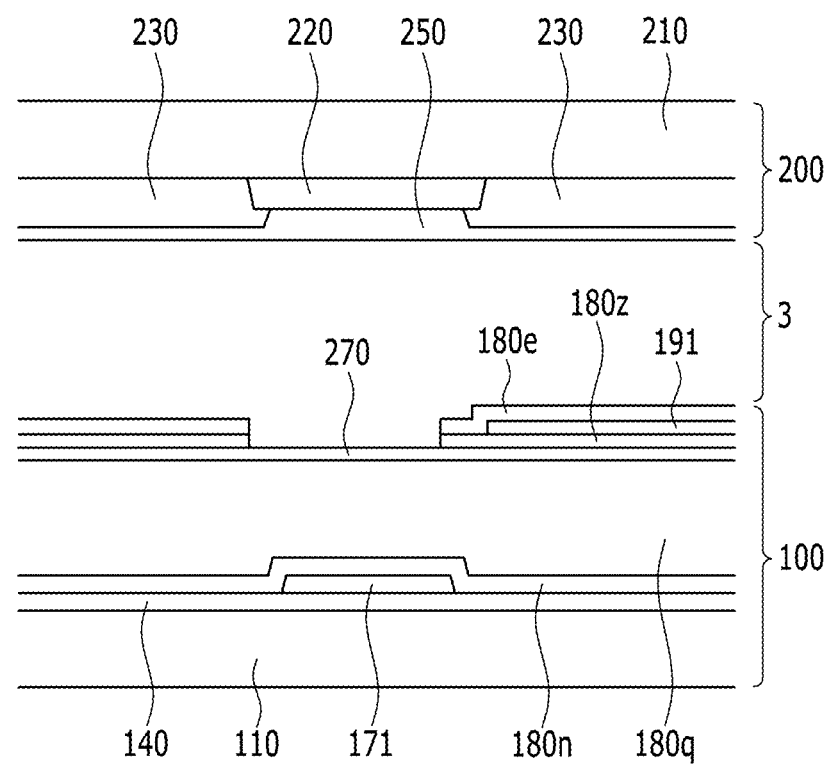
FIG. 4 is a cross-sectional view of an alternative exemplary embodiment of a liquid crystal display, corresponding to the cross-sectional view of FIG. 3.

Then, an alternative exemplary embodiment of a liquid crystal display according to the invention will be described with reference to FIG. 4. FIG. 4 is a cross-sectional view of an alternative exemplary embodiment of the liquid crystal display corresponding to the cross-sectional view of FIG. 3.

The liquid crystal display shown in FIG. 4 is substantially the same as the liquid crystal display shown in FIGS. 1 to 3, except for the interlayer insulating layer 180z. The same or like elements shown in FIG. 4 have been labeled with the same reference characters as used above to describe the exemplary embodiments of the liquid crystal display shown in FIGS. 1 to 3, and any repetitive detailed description thereof will hereinafter be omitted or simplified.

In an exemplary embodiment of the liquid crystal display, as shown in FIG. 4, the interlayer insulating layer 180z is not exist in the partial region in the lower region of the black matrix. In such an embodiment of the liquid crystal display, a portion of the additional insulating layer 180e and the interlayer insulating layer 180z in a region below and overlapping the black matrix 220 may be removed. In such an embodiment, the region, in which the interlayer insulating layer 180z does not exist, overlaps the black matrix 220 overlapping the data line 171, that is, a region corresponding to the vertical portion of the black matrix 220.

The interlayer insulating layer 180z having the structure described above may be provided by providing an interlayer insulating layer to overlap the entire black matrix 220, and then selectively etching only a portion thereof in a region below and overlapping the black matrix 220.

In an alternative exemplary embodiment, the interlayer insulating layer may be provided by forming all of the interlayer insulating layer and the additional insulating layer to overlap the entire black matrix 220, and then simultaneously etching the portions of the interlayer insulating layer and the additional insulating layer in a region below and overlapping the black matrix 220.

As described above, in an exemplary embodiment, all of the interlayer insulating layer 180e and the additional insulating layer 180z do not exist in a region overlapping the vertical portion of the black matrix 220 of the liquid crystal display, such that the interlayer insulating layer 180e and the additional insulating layer 180z does not overlap the common electrode 270.

Figure 5:
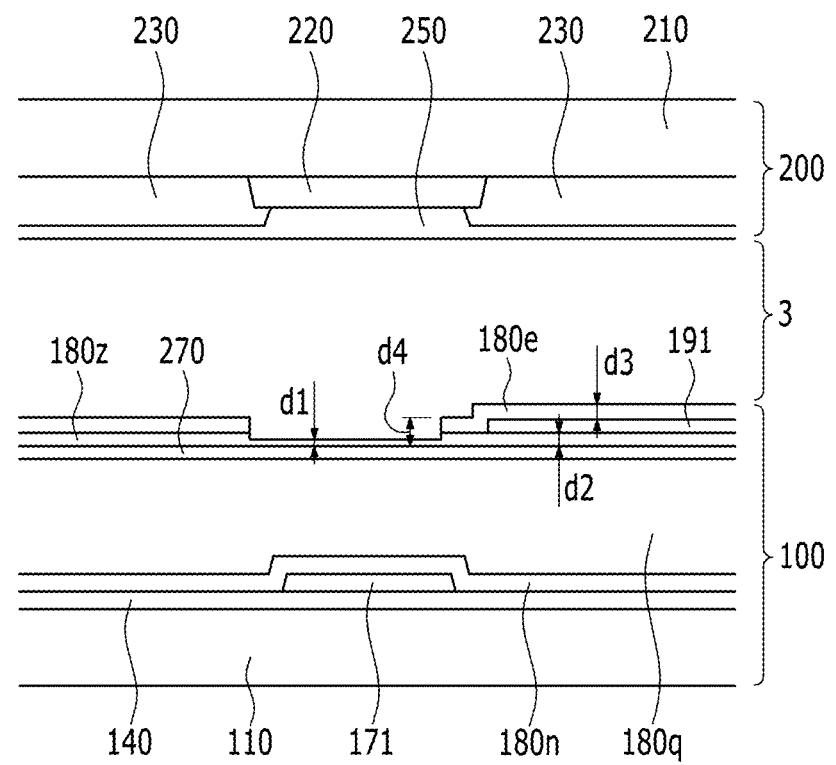
FIG. 5 is a cross-sectional view of another alternative exemplary embodiment of a liquid crystal display according to the invention.

Then, another alternative exemplary embodiment of a liquid crystal display according to the invention will be described with reference to FIG. 5. FIG. 5 is a cross-sectional view of another alternative exemplary embodiment of the liquid crystal display, corresponding to the cross-sectional view of FIG. 3. The liquid crystal display shown in FIG. 5 is substantially the same as the liquid crystal display shown in FIGS. 1 to 3, except for the interlayer insulating layer 180z. The same or like elements shown in FIG. 5 have been labeled with the same reference characters as used above to describe the exemplary embodiments of the liquid crystal display shown in FIGS. 1 to 3, and any repetitive detailed description thereof will hereinafter be omitted or simplified.

In an exemplary embodiment, as shown in FIG. 5, the additional insulating layer 180e is on the exposed pixel electrode 191 and interlayer insulating layer 180z, and the additional insulating layer 180e does not exist in a region overlapping the black matrix 220.

In such an embodiment, as shown in FIG. 5, a thickness of the interlayer insulating layer 180z is less in a region below and overlapping the black matrix. In an exemplary embodiment, the liquid crystal display may be manufactured by removing the additional insulating layer 180e from a region below and overlapping the black matrix 220, and partially etching a part of the interlayer insulating layer 180z from a region below and overlapping the black matrix 220, such that the thickness of the interlayer insulating layer 180z in a region below and overlapping the black matrix 220 is less.

In such an embodiment, a method of selectively etching the interlayer insulating layer is substantially the same as the method thereof described above.

In such an embodiment, the thickness of the interlayer insulating layer 180z in a region below and overlapping the black matrix 220 may be equal to or lower than about 50% of a thickness of the interlayer insulating layer 180z, that is, the thickness of other portion of the interlayer insulating layer 180z in a region other than the region overlapping the black matrix 220.

Referring to FIG. 5, the thickness of the additional insulating layer 180e is denoted by d3, the thickness of the interlayer insulating layer 180z in a region below and overlapping of the black matrix (hereinafter, a light blocking portion) is denoted by d1, and a thickness of the interlayer insulating layer 180z in the remaining region, which does not overlap the black matrix (hereinafter, an opening portion), is denoted by d2.

In an exemplary embodiment, d2 and d3 may be about 2,000 Å, and the thickness d1 of the interlayer insulating layer 180z in the region below and overlapping the black matrix 220 may be about 1,000 Å.

In such an embodiment, the total thickness d4 of the insulating layers in the opening portion is about 4,000 Å, which is d2 (2,000 Å)+d3 (2,000 Å). However, the total thickness d1 of the insulating layers in the region below and overlapping the black matrix, that is, in the light blocking portion, is equal to or less than about 1,000 Å. Accordingly, the thickness of the insulating layers in the light blocking portion is less than the thickness of the insulating layers in the opening portion.

As described above, in an exemplary embodiment of the liquid crystal display according to the invention, a thickness of the passivation layer in the light blocking portion, e.g., the region overlapping the black matrix, is less than the thickness of the passivation layer in the opening portion, e.g., a region, which does not overlap the black matrix. In an exemplary embodiment of the invention, a surface afterimage and a line afterimage, which may be recognized as a surface afterimage by a thickness difference of the passivation layer, may be effectively reduced.

Now, a surface afterimage and a line afterimage recognized as a surface in an exemplary embodiment of the invention will be described in detail.

A surface afterimage means an image in bright and dark regions are repeated in the unit of a surface in a middle grayscale image. The surface afterimage is generated because optimum common voltages are different between a black image and a white image. An afterimage by a difference in the optimum common voltages is referred to as a direct current ("DC") afterimage.

The DC afterimage may be offset by an ion impurity existing within the liquid crystal. The ion impurity is adsorbed to the alignment layer of the pixel electrode and the common electrode to cause a voltage drop. In this case, a size of a voltage changed per one ion impurity is expressed by the following Equation.

$$V_{cap} = \frac{Q}{C} = \frac{d_{cap}}{\varepsilon_0 \cdot \varepsilon_r \cdot A_{cap}} \cdot Q$$

Referring to the Equation above, when a thickness $d_{cap}$ is increased, a voltage $V_{cap}$ changed per one ion Q is increased. Accordingly, when the thickness $d_{cap}$ is increased, a change in a voltage is increased even though the same number of ions moves, and a surface afterimage may be rapidly removed.

As described above, in an exemplary embodiment of the liquid crystal display according to the invention, the additional insulating layer 180e is disposed only in the opening portion, such that the thickness $d_{cap}$ may be determined based on the thickness of the additional insulating layer. Accordingly, even though the same number of ions are adsorbed, the voltage is considerably changed, such that the DC afterimage is rapidly offset, thereby effectively removing the surface afterimage.

In an exemplary embodiment, a line afterimage recognized as a surface afterimage means a sharp change in luminance in a boundary surface recognized as a surface afterimage, and may be explained based on the Mach band theory.

Figure 6:
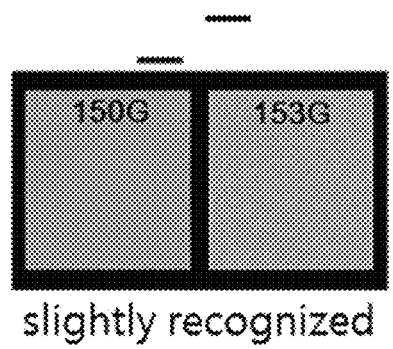
FIG. 6 is a view illustrating three types of images having different grayscale change degrees on a boundary surface.
Figure 6:
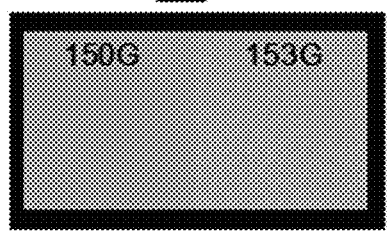
Figure 6:
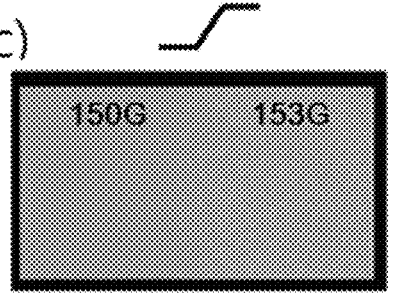

FIG. 6 illustrates three types of images having different grayscale change degrees on a boundary surface.

Referring to (a), (b) and (c) of FIG. 6, a grayscale value of a first region may be 150, and a grayscale value of a second region, adjacent to the first region, may be 153.

In (a) of FIG. 6 in which the boundary surface is in a light blocking portion, a boundary of both regions is not recognized. However, in (b) and (c) of FIG. 6, the boundary surface is the opening portion.

In (b) of FIG. 6, a grayscale is sharply increased in the boundary surface, but in (c) of FIG. 6, a grayscale in the boundary surface is slowly changed. In (b) of FIG. 6, in which the grayscale is sharply changed in the boundary surface, the boundary of both regions is clearly recognized. However, in (c) of FIG. 6, the boundary of both regions is not clearly recognized. That is, in (b) of FIG. 6, in which the grayscale is sharply changed, a line afterimage exists, and the line afterimage may be recognized as a surface afterimage.

As described above, in an exemplary embodiment of the invention, the grayscale in the boundary surface are slowly changed without being sharply changed to reduce a line afterimage recognized as a surface afterimage.

In an exemplary embodiment of the liquid crystal display, in a boundary portion of a pixel displaying a black image and a pixel displaying a white image, voltages are different at a left side and a right side of the boundary portion (light blocking portion). The voltage difference is offset by adsorption of the ion impurity at a lower side of the boundary portion (light blocking portion).

When the voltage difference is sharply offset by the ion impurity, the grayscale is sharply changed as illustrated in (b) of FIG. 6. When the sharp change in the grayscale is recognized outside the region of the black matrix, the sharp change may be viewed as a line afterimage recognized as a surface afterimage.

Accordingly, to improve, e.g., reduced, the line afterimage recognized as the surface afterimage, the voltage difference in the boundary portion of the black image and the white image may be offset substantially gradually.

As described above, a voltage changed by one ion impurity is represented by the Equation below.

$$V_{cap} = \frac{Q}{C} = \frac{d_{cap}}{\varepsilon_0 \cdot \varepsilon_r \cdot A_{cap}} \cdot Q$$

Accordingly, a grayscale in the boundary surface may be set to be gradually changed to improve a line afterimage recognized as a surface afterimage in the light blocking portion. Accordingly, in an exemplary embodiment, the amount of voltages changed per unit ion may be decreased in the boundary surface.

Referring to the Equation above, when the thickness $d_{cap}$ is decreased, the voltage $V_{cap}$ changed per one ion Q is decreased.

Accordingly, in an exemplary embodiment of the liquid crystal display according to the invention, the thickness $d_{cap}$ is decreased by removing the passivation layer in a region light blocked by the black matrix, or decreasing a thickness of the passivation layer. Accordingly, the amount of changed voltages per one ion adsorption is decreased, and the grayscale in the boundary surface is not sharply changed, such that the line afterimage recognized as the surface afterimage in the boundary surface of the black image and the white image is improved.

Figure 7:
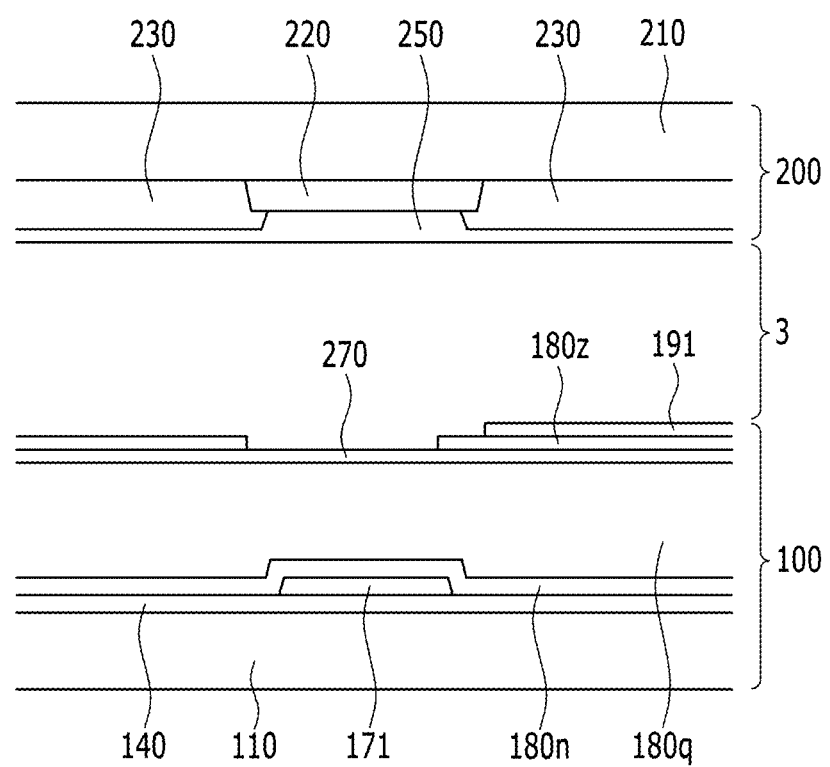
FIG. 7 is a cross-sectional view of another alternative exemplary embodiment of the liquid crystal display, corresponding to the cross-sectional view of FIG. 3.

Then, another alternative exemplary embodiment of a liquid crystal display according to the invention will be described with reference to FIG. 7. FIG. 7 is a cross-sectional view of another alternative exemplary embodiment of the liquid crystal display, corresponding to the cross-sectional view of FIG. 3.

The liquid crystal display shown in FIG. 7 is substantially the same as the liquid crystal display shown in FIGS. 1 to 3, except for the interlayer insulating layer 180z and the additional insulating layer 180e. The same or like elements shown in FIG. 7 have been labeled with the same reference characters as used above to describe the exemplary embodiments of the liquid crystal display shown in FIGS. 1 to 3, and any repetitive detailed description thereof will hereinafter be omitted or simplified.

In an exemplary embodiment of the liquid crystal display, as shown in FIG. 7, the additional insulating layer 180e is omitted, and the interlayer insulating layer 180z is not disposed in a lower region of the vertical portion of the black matrix 220. Accordingly, in such an embodiment of the liquid crystal display, thicknesses of the passivation layer in the opening portion and the light blocking portion are different from each other.

Figure 8:
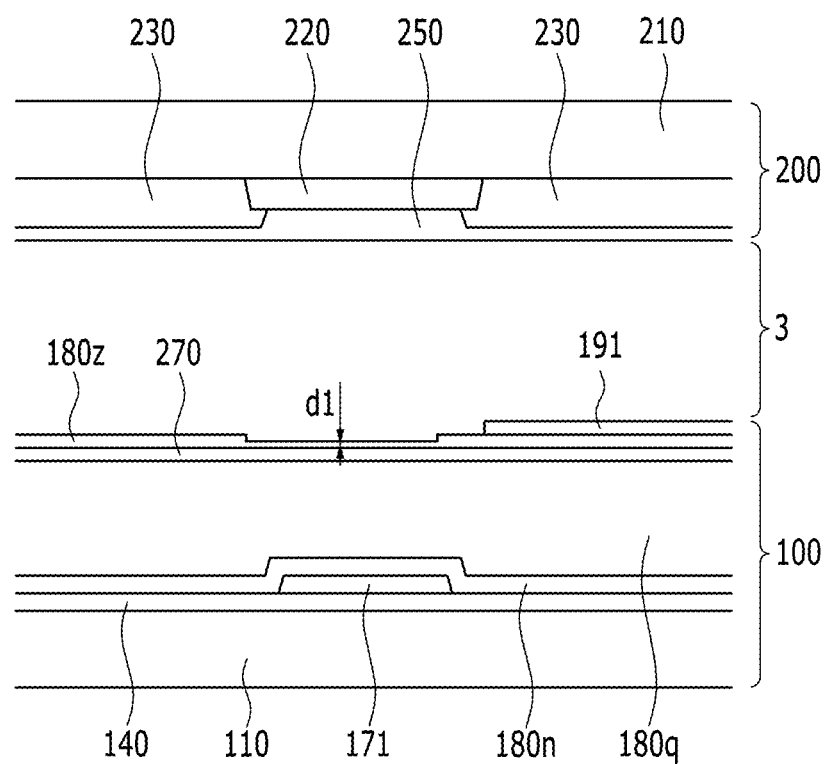
FIG. 8 is a cross-sectional view of another alternative exemplary embodiment of the liquid crystal display, corresponding to the cross-sectional view of FIG. 3.

Another alternative exemplary embodiment of a liquid crystal display according to the invention will be described with reference to FIG. 8. FIG. 8 is a cross-sectional view of another alternative exemplary embodiment of the liquid crystal display corresponding to the cross-sectional view of FIG. 3. The liquid crystal display shown in FIG. 4 is substantially the same as the liquid crystal display shown in FIGS. 1 to 3, except for the additional insulating layer 180e and the interlayer insulating layer 180z. The same or like elements shown in FIG. 4 have been labeled with the same reference characters as used above to describe the exemplary embodiments of the liquid crystal display shown in FIGS. 1 to 3, and any repetitive detailed description thereof will hereinafter be omitted or simplified.

In an exemplary embodiment of the liquid crystal, as shown in FIG. 8, the additional insulating layer 180e may be omitted, and a thickness d1 of the interlayer insulating layer 180z in the region below and overlapping the black matrix 220 is less than a thickness of the interlayer insulating layer in the opening portion region. The thickness difference may be provided by applying the interlayer insulating layer on the entire substrate, and then selectively etching a portion of the interlayer insulating layer in the region below and overlapping the black matrix 220. Accordingly, in such an embodiment of the liquid crystal display, the thicknesses of the insulating layers in the opening portion and the light blocking portion are different from each other.

Figure 9:
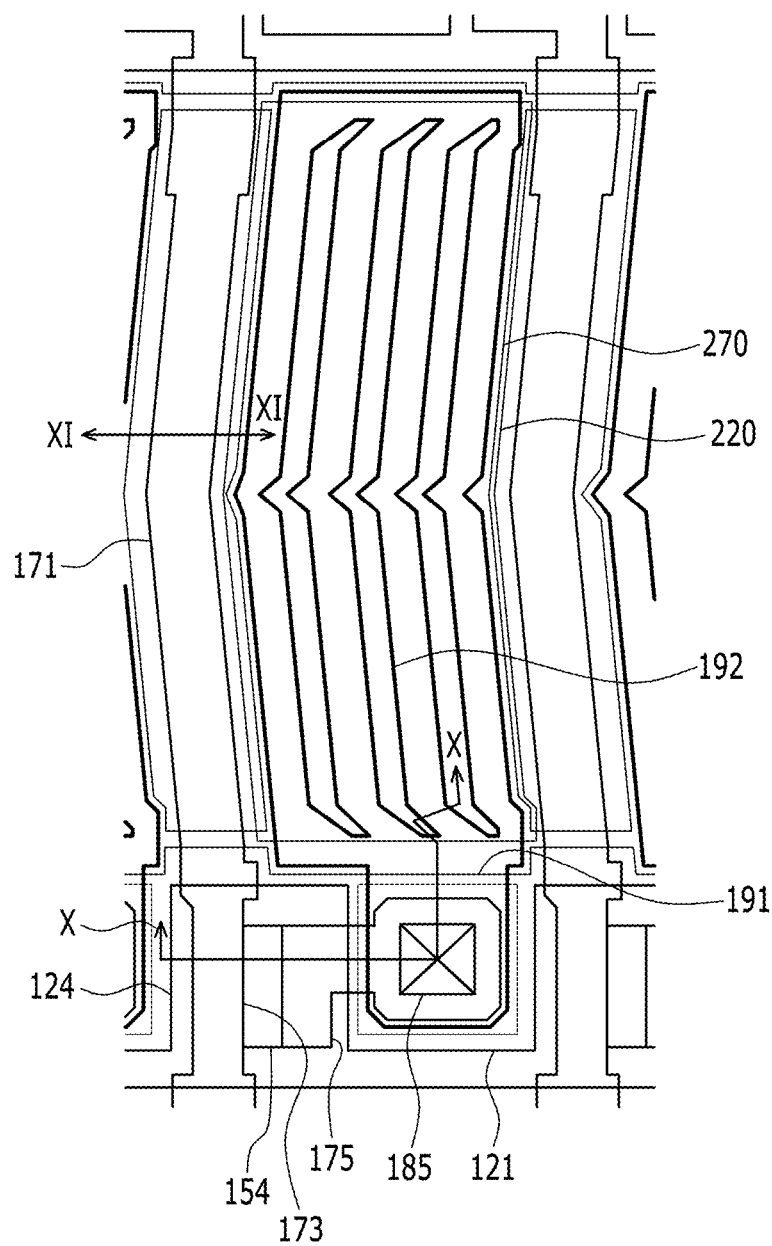
FIG. 9 is a plan view of an alternative exemplary embodiment of a liquid crystal display, according to the invention.
Figure 10:
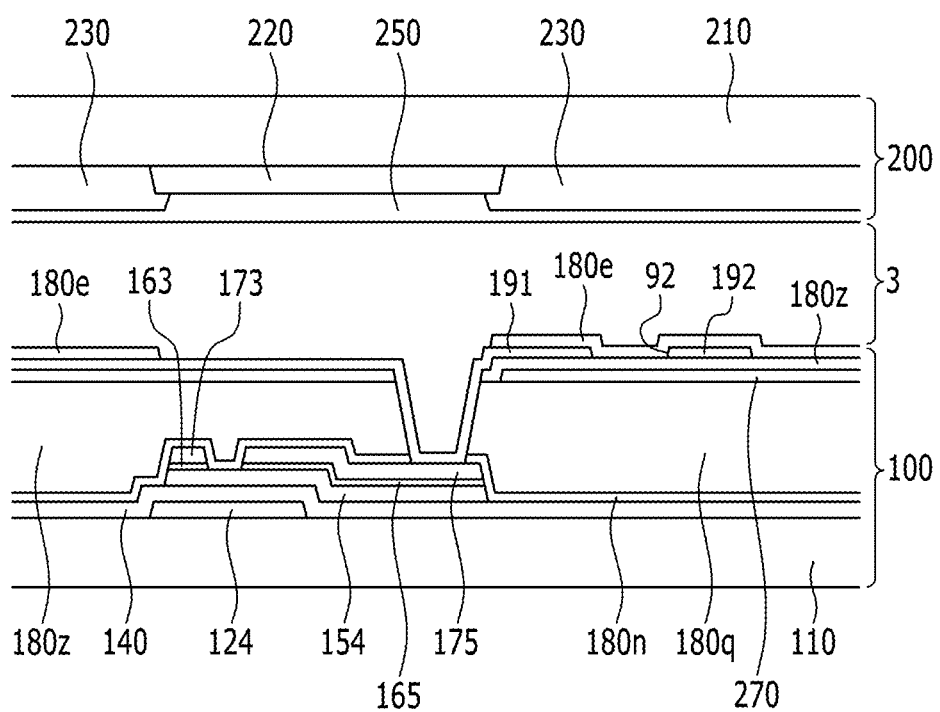
FIG. 10 is a cross-sectional view taken along line X-X of the liquid crystal display illustrated in FIG. 9.
Figure 11:
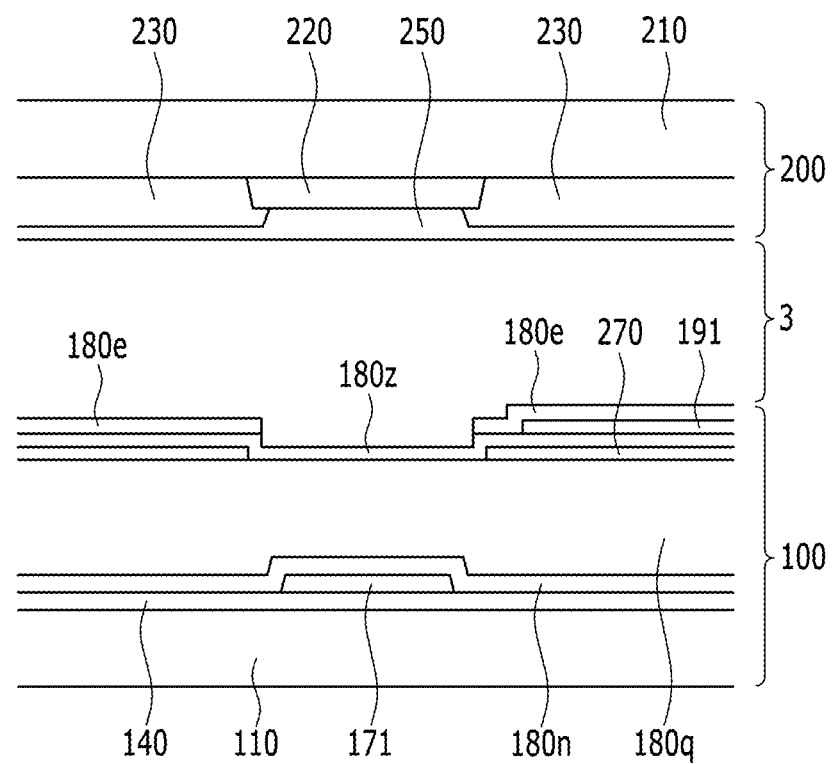
FIG. 11 is a cross-sectional view taken along line XI-XI of the liquid crystal display illustrated in FIG. 9.

Another alternative exemplary embodiment of a liquid crystal display according to the invention will be described with reference to FIGS. 9 to 11. FIG. 9 is a plan view of an alternative exemplary embodiment of a liquid crystal display according to the invention, and FIG. 10 is a cross-sectional view taken along line X-X of the liquid crystal illustrated in FIG. 9. FIG. 11 is a cross-sectional view taken along line XI-XI of the liquid crystal display illustrated in FIG. 9.

The liquid crystal display shown in FIGS. 9 to 11 is substantially the same as the liquid crystal display shown in FIGS. 1 to 3, except for the common electrode 270. The same or like elements shown in FIGS. 9 to 11 have been labeled with the same reference characters as used above to describe the exemplary embodiments of the liquid crystal display shown in FIGS. 1 to 3, and any repetitive detailed description thereof will hereinafter be omitted or simplified.

In an exemplary embodiment of the liquid crystal, as shown in FIGS. 9 to 11, the common electrode 270 disposed on the organic layer 180q has an opening portion. In such an embodiment, as illustrated in FIG. 9, the common electrode 270 has an opening portion in a region corresponding to a surrounding area of the drain electrode 175, and an opening portion in a region corresponding to an upper region of the data line 171.

The other features relating to the interlayer insulating layer 180z and the additional insulating layer 180e shown in FIGS. 9 to 11 are substantially the same as the features of those described with reference to FIGS. 1 to 3.

Accordingly, referring to FIG. 11, in an exemplary embodiment of the invention, the additional insulating layer 180e is not disposed in a region overlapping the black matrix, and the opening portion of the common electrode 270 is positioned in a lower region of the additional insulating layer. Accordingly, in such an embodiment of the liquid crystal display, the thicknesses of insulating layers in the opening portion and the light blocking portion are different from each other.

Then, alternative exemplary embodiments of the liquid crystal display according to the invention will be described with reference to FIGS. 12 to 15. FIGS. 12 to 15 are cross-sectional views of alternative exemplary embodiment of the liquid crystal display corresponding to the cross-sectional view of FIG. 11. The liquid crystal displays shown in FIGS. 12 to 15 are substantially the same as the liquid crystal display shown in FIGS. 9 to 11, except for the interlayer insulating layer 180z, the organic layer 180q or the passivation layer 180n. The same or like elements shown in FIGS. 12 to 15 have been labeled with the same reference characters as used above to describe the exemplary embodiments of the liquid crystal display shown in FIGS. 9 to 11, and any repetitive detailed description thereof will hereinafter be omitted or simplified.

Figure 12:
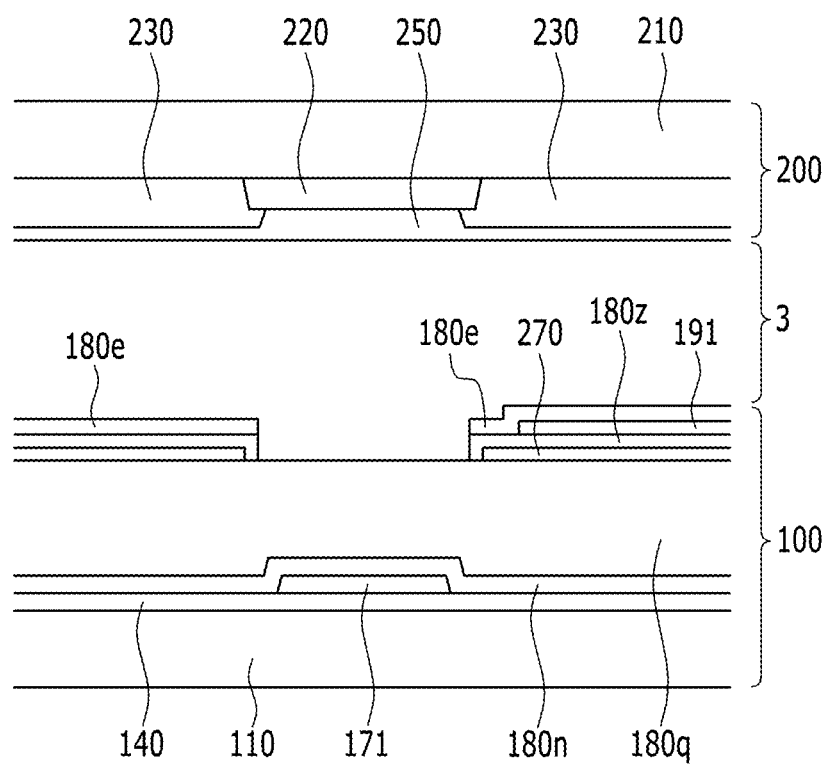
FIGS. 12 to 15 are cross-sectional views of alternative exemplary embodiments of the liquid crystal display, corresponding to the cross-sectional view of FIG. 11.

Referring to FIG. 12, in an exemplary embodiment of the liquid crystal display, the interlayer insulating layer 180z as well as the additional insulating layer 180e are not disposed a region overlapping the vertical portion of the black matrix 220. In such an embodiment of the liquid crystal display, the common electrode 270 has the opening portion in the region corresponding to an upper portion of the data line (e.g., the vertical portion of the black matrix), the additional insulating layer 180e and the interlayer insulating layer 180z are removed from the lower region corresponding to the vertical portion of the black matrix 220, such that the organic layer 180q is exposed.

Figure 13:
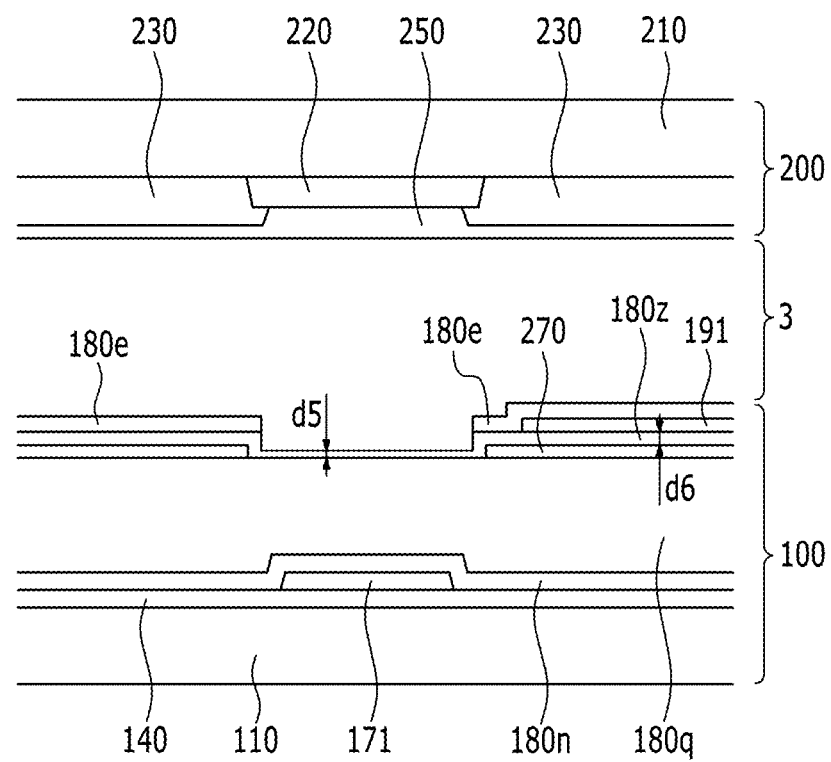

Referring to FIG. 13, in an exemplary embodiment of the liquid crystal display, the additional insulating layer 180e a region overlapping the vertical portion of the black matrix 220 may be removed, and a part of the interlayer insulating layer 180z in a region overlapping the vertical portion of the black matrix 220 is etched, such that a thickness of the interlayer insulating layer 180z a region overlapping the vertical portion of the black matrix 220 is less than the thickness of the interlayer insulating layer 180z in the opening portion.

In such an embodiment, the thickness of the interlayer insulating layer 180z a region overlapping the black matrix 220 may be equal to or less than about 50% of the thickness of the interlayer insulating layer 180z in the opening portion.

Referring to FIG. 12, a thickness of the additional insulating layer 180e is denoted by d3, a thickness of the interlayer insulating layer 180z a region overlapping the black matrix is denoted by d1, and a thickness of the interlayer insulating layer in in the opening portion, that is, a region, which is not covered by the black matrix, is denoted by d2.

In one exemplary embodiment, for example, d2 and d3 may be about 2,000 Å, and the d1 may be about 1,000 Å.

In such an embodiment, a total thickness of the insulating layers in the opening portion is about 4,000 Å, which is equal to d2 (2000 Å)+d3 (2000 Å). However, the total thickness d1 of the insulating layers in a region overlapping the black matrix is equal to or lower than 1000 Å. Accordingly, the thickness of the entire insulating layers in a region overlapping the black matrix is less than the thickness of the entire insulating layers in the region which does not correspond to the black matrix.

Figure 14:
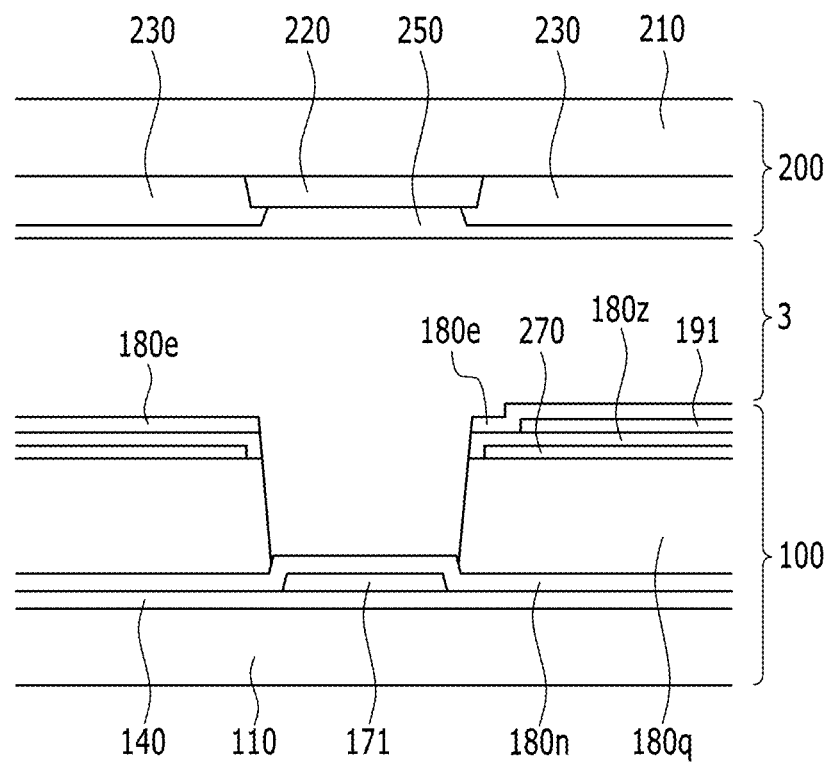

Referring to FIG. 14, in an alternative exemplary embodiment of the liquid crystal display, all of the additional insulating layer 180e, the interlayer insulating layer 180z and the organic layer 180q are removed from the lower region corresponding to the vertical portion of the black matrix 220. Accordingly, in such an embodiment, the passivation layer 108n is exposed through the additional insulating layer 180e, the interlayer insulating layer 180z and the organic layer 180q a region overlapping the vertical portion of the black matrix 220, and a difference in a thickness of the layers between the light blocking portion and the opening portion is substantially increased.

Figure 15:
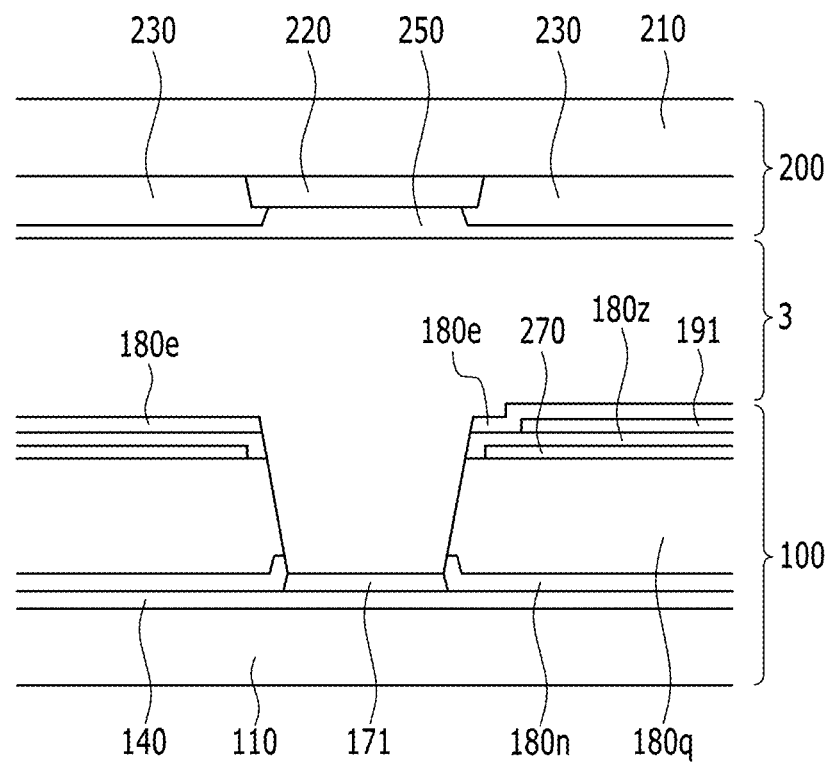

Referring to FIG. 15, in another alternative exemplary embodiment of the liquid crystal display, all of the additional insulating layer 180e, the interlayer insulating layer 180z, the organic layer 180q and the passivation layer 180n are removed from the lower region corresponding to the vertical portion of the black matrix 220. Accordingly, in such an embodiment of the liquid crystal display, as shown in FIG. 15, the gate line 171 is exposed through the additional insulating layer 180e, the interlayer insulating layer 180z, the organic layer 180q and the passivation layer 180n a region overlapping the vertical portion of the black matrix 220. Accordingly, the thicknesses of the passivation layer between the light blocking portion and the opening portion are different from each other. In such an embodiment, all of the passivation layer, the organic layer, the interlayer insulating layer and the additional insulating layer exist in the opening portion, while all of the passivation layer, the organic layer, the interlayer insulating layer and the additional insulating layer do not exist in the light blocking portion.

Then, other alternative exemplary embodiments of the liquid crystal display according to the invention will be described with reference to FIGS. 16 to 19. FIGS. 16 to 19 are cross-sectional views of other alternative exemplary embodiments of the liquid crystal display, corresponding to the cross-sectional view of FIG. 11. The liquid crystal displays shown in FIGS. 16 to 19 are substantially the same as the liquid crystal display shown in FIGS. 12 to 15, except for the additional insulating layer 180e. The same or like elements shown in FIGS. 16 to 19 have been labeled with the same reference characters as used above to describe the exemplary embodiments of the liquid crystal display shown in FIGS. 12 to 15, and any repetitive detailed description thereof will hereinafter be omitted or simplified.

Figure 16:
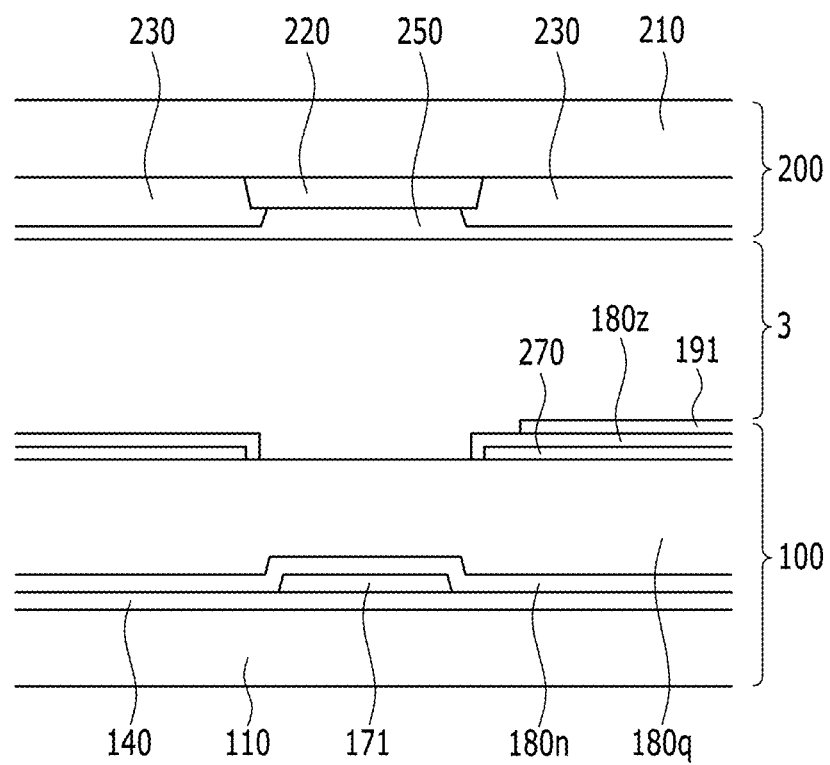
FIGS. 16 to 19 are cross-sectional views of other alternative exemplary embodiments of the liquid crystal display, corresponding to the cross-sectional view of FIG. 11.

The liquid crystal display shown in FIG. 16 is similar to the liquid crystal display shown in FIG. 12. However, in such an embodiment of the liquid crystal display as shown in FIG. 16, the additional insulating layer 180e may be omitted, and the interlayer insulating layer 180z is removed from the lower region corresponding to the vertical portion of the black matrix 220.

Figure 17:
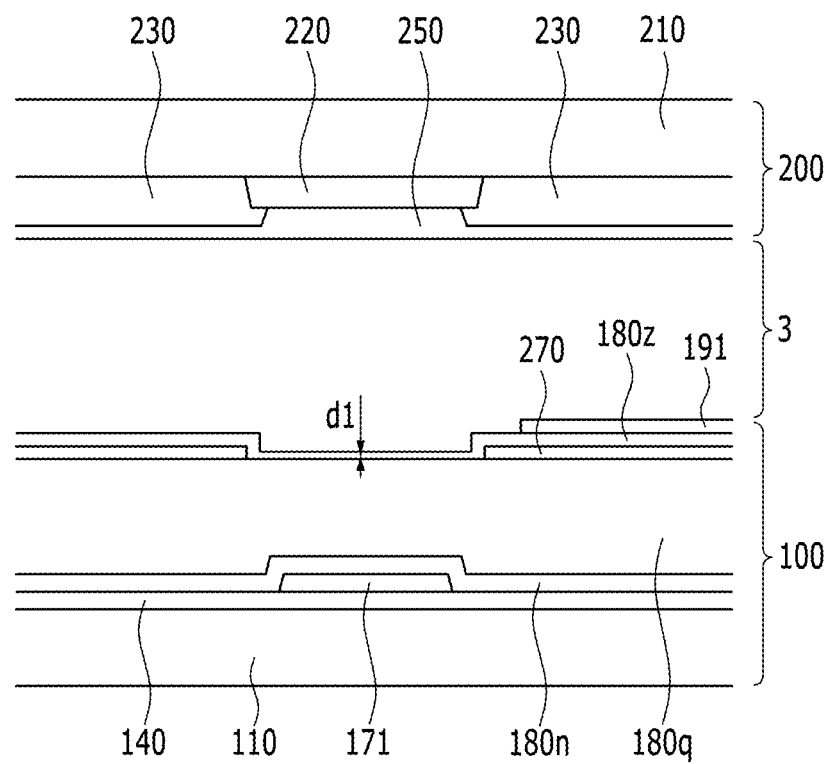

The liquid crystal display shown in FIG. 17 is similar to the liquid crystal display shown in FIG. 13. However, in such an embodiment of the liquid crystal display shown in FIG. 17, the additional insulating layer 180e may be omitted, and the thickness d1 of the interlayer insulating layer 180z in a region below and overlapping the black matrix 220 is less than a thickness of the interlayer insulating layer in the opening portion region.

Figure 18:
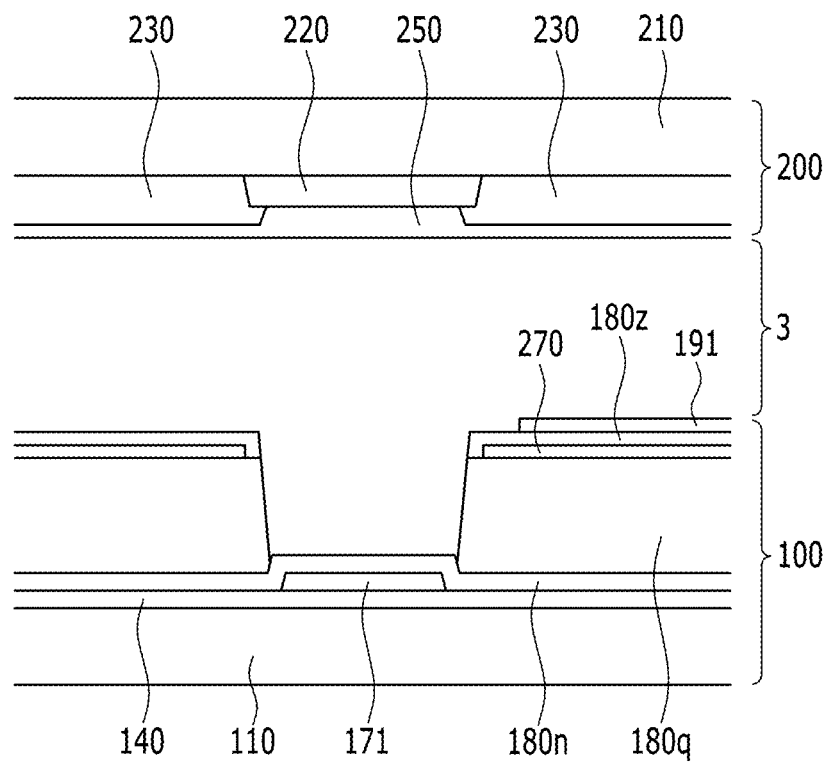

Referring to FIG. 18, the liquid crystal display shown in FIG. 18 is similar to the liquid crystal display shown in FIG. 14. However, in such an embodiment of the liquid crystal display shown in FIG. 18, the additional insulating layer 180e does not exist. In the liquid crystal display according to the exemplary embodiment of FIG. 18, the organic layer and the interlayer insulating layer are removed from the lower region corresponding to the vertical portion of the black matrix 220.

Figure 19:
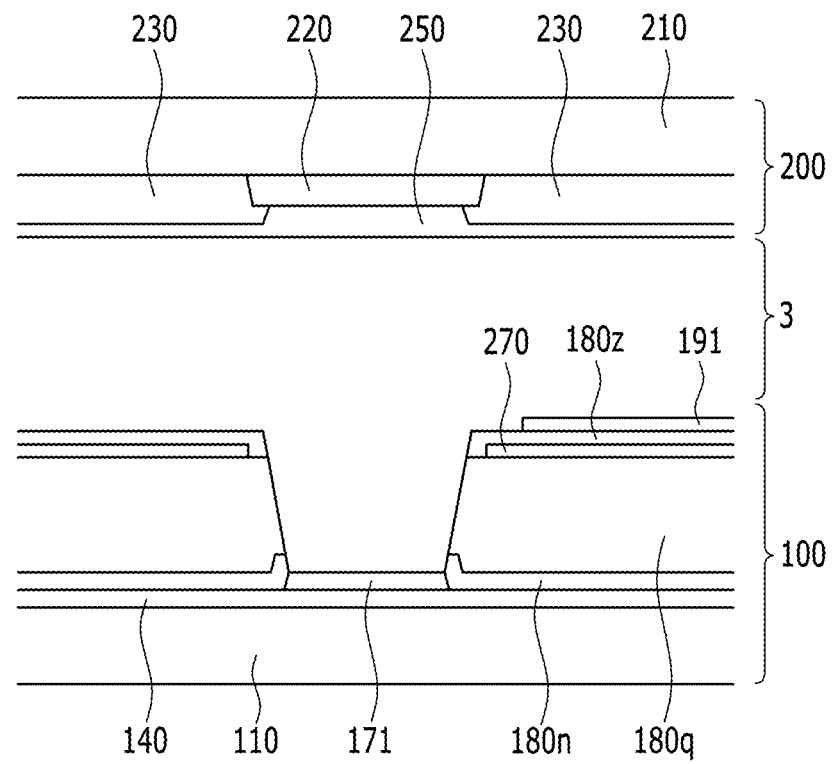

Referring to FIG. 19, the liquid crystal display shown in FIG. 19 is similar to the liquid crystal display shown in FIG. 15. However, in such an embodiment of the liquid crystal display shown in FIG. 19, the additional insulating layer 180e may be omitted. In an exemplary embodiment of the liquid crystal display, as shown in FIG. 19, the passivation layer, the organic layer and the interlayer insulating layer may be removed from the lower region corresponding to the vertical portion of the black matrix 220, such that the data line 171 is exposed therethrough.

Figure 20:
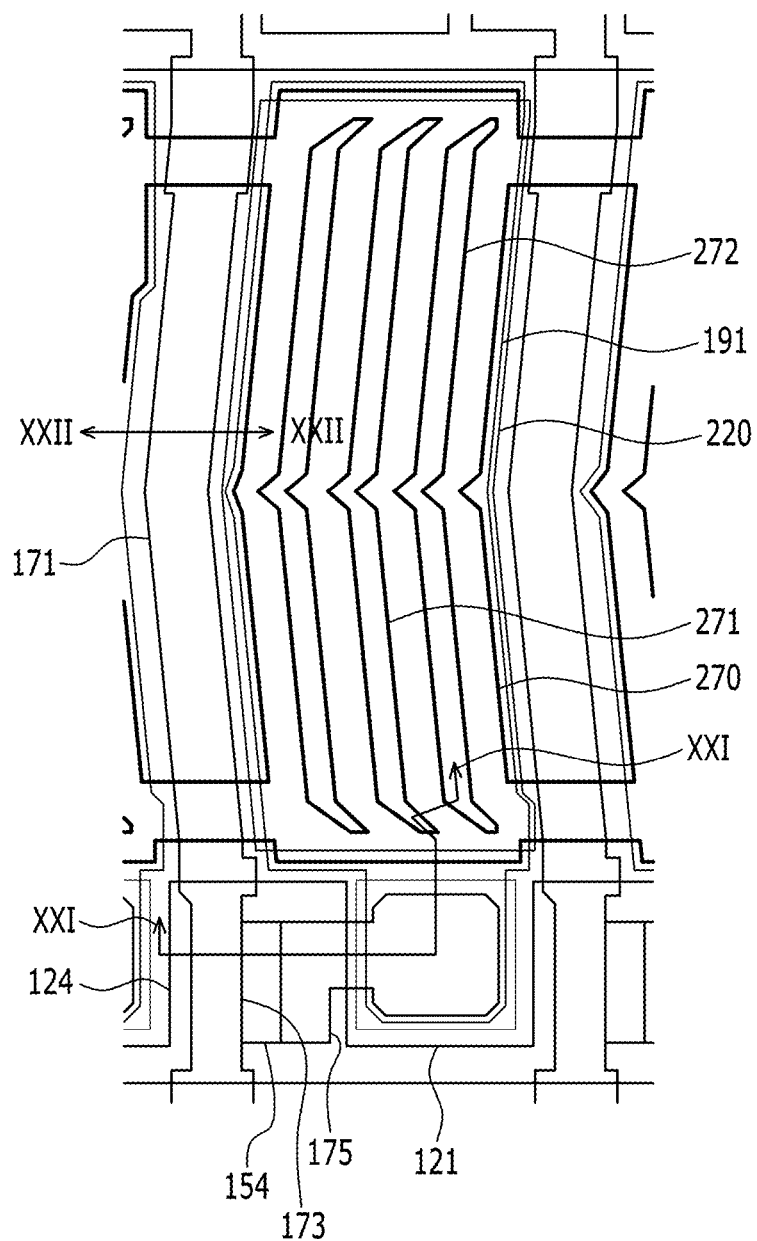
FIG. 20 is a plan view of another alternative exemplary embodiment of a liquid crystal display according to the invention.
Figure 21:
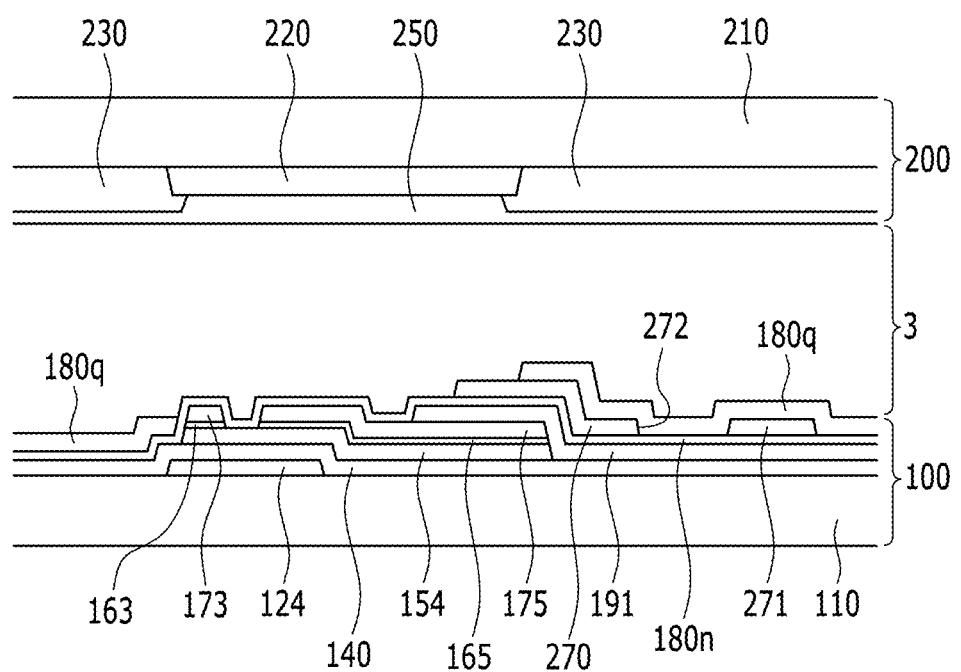
FIG. 21 is a cross-sectional view taken along line XXII-XXII of the liquid crystal display illustrated in FIG. 20.
Figure 22:
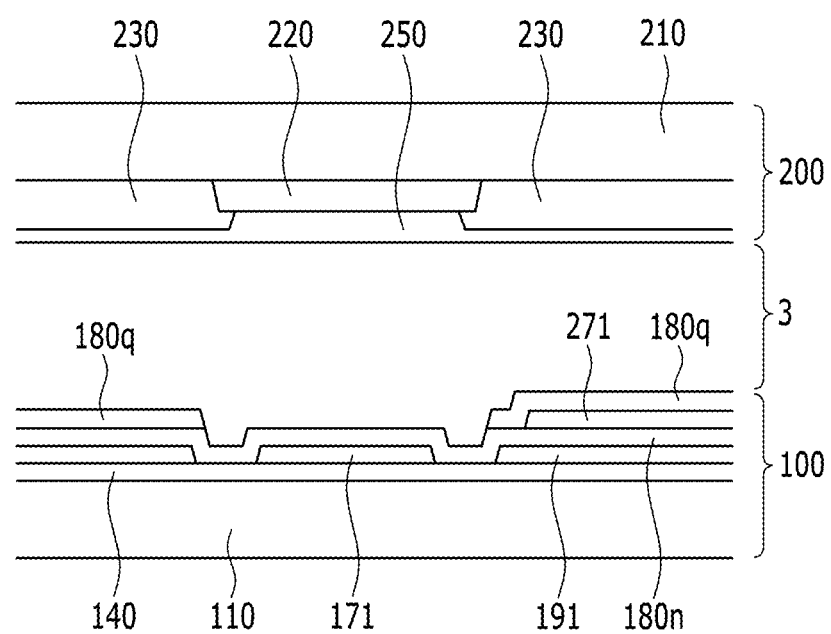
FIG. 22 is a cross-sectional view taken along line XXII-XXII of the liquid crystal display illustrated in FIG. 20.

Other alternative exemplary embodiment of the liquid crystal display according to the invention will be described with reference to FIGS. 20 to 22. The liquid crystal display shown in FIGS. 20 to 22 is similar to the liquid crystal display shown in FIGS. 1 to 3, except for the additional insulating layer 180e. The same or like elements shown in FIGS. 20 to 22 have been labeled with the same reference characters as used above to describe the exemplary embodiments of the liquid crystal display shown in FIGS. 1 to 3, and any repetitive detailed description thereof will hereinafter be omitted or simplified.

FIG. 20 is a plan view of an alternative exemplary embodiment of a liquid crystal display according to the invention, and FIG. 21 is a cross-sectional view taken along line XXII-XXII of the liquid crystal display illustrated in FIG. 20. FIG. 22 is a cross-sectional view taken along line XXII-XXII of the liquid crystal display illustrated in FIG. 20.

Referring to FIGS. 20 and 21, an exemplary embodiment of the liquid crystal display includes a lower panel 100 and an upper panel, which face each other, and a liquid crystal layer 3 interposed therebetween.

A gate conductor including a gate line 121 is disposed on an insulating substrate 110 of the lower panel 100.

A gate insulating layer 140 including silicon nitride (SiNx), silicon oxide (SiOx), or the like is disposed on the gate conductor.

A semiconductor 154 is disposed on the gate insulating layer 140.

Ohmic contacts 163 and 165 are disposed on the semiconductor 154. In an exemplary embodiment, where the semiconductor 154 is an oxide semiconductor, the ohmic contacts 163 and 165 may be omitted.

A data conductor including a data line 171 that includes a source electrode 173 and a drain electrode 175 is disposed on the ohmic contacts 163 and 165 and the gate insulating layer 140.

In an exemplary embodiment, as shown in FIGS. 21 and 22, a pixel electrode 191 may be disposed directly on the drain electrode 175. The pixel electrode 191 has a flat shape, e.g., a plate-like shape, and may be disposed in each pixel region.

In an exemplary embodiment, a passivation layer 180 is disposed on the data conductors 171, 173 and 175, the gate insulating layer 140, an exposed portion of the semiconductor 154, and the pixel electrode 191. However, in an alternative exemplary embodiment of the liquid crystal display according to the invention, a passivation layer 180n may be disposed between the pixel electrode 191 and the data line 171, and the pixel electrode 191 may be connected to the drain electrode 175 through a contact hole (not illustrated) defined in the passivation layer 180n.

A common electrode 270 is disposed on the passivation layer 180n. The common electrodes 270 are connected to each other to receive a common voltage from a common voltage application part disposed outside the display region.

The common electrode 270 includes a curved edge which is substantially parallel to a first bent portion and a second bent portion of the data line 171, and the common electrodes 270 disposed in the adjacent pixels are connected to each other. The common electrode 270 has includes a plurality of branch electrodes 271, and a plurality of cutouts 272 is defined therein by the plurality of branch electrodes 271.

An additional insulating layer 180e is disposed on the common electrode 270. The additional insulating layer 180e is disposed on the entire common electrode 270, but is not disposed in a region overlapping a black matrix 220.

The black matrix 220 may be disposed on an insulating substrate 210 of the upper panel 200. The insulating substrate 210 of the upper panel 200 may include a transparent material such as glass, plastic, or the like. In an alternative exemplary embodiment, the black matrix 220 may be disposed in the lower panel 100. The black matrix 220 covers the data line 171 extending substantially in a vertical direction, and a gate line 121 extending substantially in a horizontal direction to cross the data line 171.

The additional insulating layer 180e may include an organic insulating material, an inorganic insulating material, or the like. In one exemplary embodiment, for example, the additional insulating layer 180e may include silicon nitride (SiNx), silicon oxide (SiOx), or the like.

The additional insulating layer 180e does not exist in a lower region of the black matrix 220. That is, the additional insulating layer 180e is not disposed on an upper region of the data line 171 and an upper region of the region in which the gate line 121 and the drain electrode 175 exist.

FIG. 21 illustrates a cross-section of a lower region of the horizontal portion of the black matrix. Referring to FIG. 21, the additional insulating layer 180e is not exist a region below and overlapping the horizontal portion of the black matrix 220.

FIG. 22 illustrates a cross-section of the region below and overlapping the vertical portion of the black matrix. Referring to FIG. 22, the additional insulating layer 180e is not exist in a region below and overlapping the vertical portion of the black matrix 220.

The additional insulating layer 180e may be provided by applying the additional insulating layer 180e on the entire black matrix 220 and then selectively etching a portion thereof only in the region below and overlapping the black matrix.

A thickness d3 of the additional insulating layer may be in a range of about 1,000 Å to about 3,000 Å. In an exemplary embodiment of the invention, the thickness d3 of the additional insulating layer may be about 2,000 Å.

In an exemplary embodiment, an alignment layer (not shown) may be disposed on the common electrode 270 and the additional insulating layer 180e. In such an embodiment, the alignment layer may be a horizontal alignment layer, and may be rubbed in a predetermined direction. In an alternative exemplary embodiment, the alignment layer may include a photoreactive material to be optically aligned.

Then, the upper panel 200 will be described.

In an exemplary embodiment, as described above, the light blocking member 220 may be disposed on the insulating substrate 210. A plurality of color filters 230 is disposed on the substrate 210. In an alternative exemplary embodiment, the color filters 230 may be disposed on the lower panel 100, and in such an embodiment, the light blocking member 220 may also be disposed on the lower panel 100.

An overcoat 250 is disposed on the color filter 230 and the light blocking member 220. In an alternative exemplary embodiment, the overcoat 250 may be omitted.

An alignment layer may be disposed on the overcoat 250. The liquid crystal layer 3 includes a nematic liquid crystal material having positive dielectric anisotropy. The liquid crystal molecules of the liquid crystal layer 3 are arranged such that a direction of a longitudinal axes thereof are substantially parallel to the display panels 100 and 200, and the liquid crystal layer has a structure in which the direction of the longitudinal axes thereof are twisted 90° from a rubbing direction of the alignment layer of the lower panel 100 to the upper panel 200 in a spiral shape.

Figure 23:
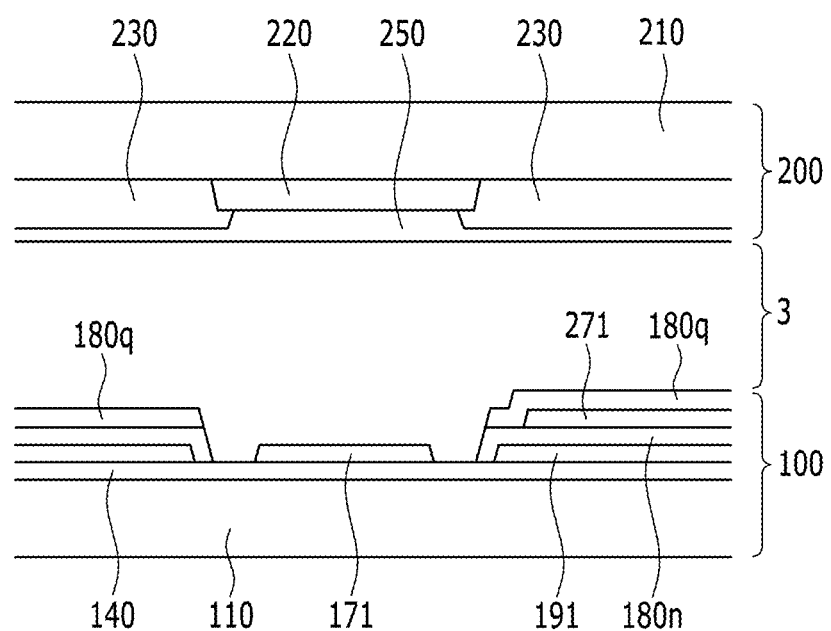
FIG. 23 is a cross-sectional view of another alternative exemplary embodiment of the liquid crystal display, corresponding to the cross-sectional view of FIG. 21.

Then, another alternative exemplary embodiment of a liquid crystal display according to the invention will be described with reference to FIG. 23. FIG. 23 is a cross-sectional view of an exemplary embodiment of the liquid crystal display corresponding to the cross-sectional view illustrated in FIG. 20, and illustrates a cross-section of the region below and overlapping the vertical portion of the black matrix.

Referring to FIG. 23, the liquid crystal display shown in FIG. 23 is similar to the liquid crystal display of FIGS. 21 and 22. The same or like elements shown in FIG. 23 have been labeled with the same reference characters as used above to describe the exemplary embodiments of the liquid crystal display shown in FIGS. 21 to 22, and any repetitive detailed description thereof will hereinafter be omitted or simplified.

In an exemplary embodiment of the liquid crystal display, as shown in FIG. 23, the passivation layer 180n does not exist in a partial region, e.g., in the region below and overlapping the black matrix. In such an embodiment of the liquid crystal display, the additional insulating layer 180e and the passivation layer 180n do not exist in a region below and overlapping the black matrix 220. In such an embodiment, the region in which the passivation layer does not exist is a region below and overlapping the black matrix 220 covering the data line 171, that is, a region corresponding to the vertical portion of the black matrix 220.

In such an embodiment, the passivation layer may be provided, e.g., formed, by applying the passivation layer 180n on the entire black matrix 220, and then selectively etching a portion thereof only a region below and overlapping the black matrix in a subsequent step.

In an alternative exemplary embodiment, the passivation layer may be provided by forming all of the passivation layer and the additional insulating layer, and then simultaneously etching a portion of the passivation layer 180n and the additional insulating layer 180e only in a region below and overlapping the black matrix.

In such an embodiment, where none of the organic layer 180q and the additional insulating layer 180e exist in the lower portion of the vertical portion of the black matrix 220, the data line 171 may be exposed.

Figure 24:
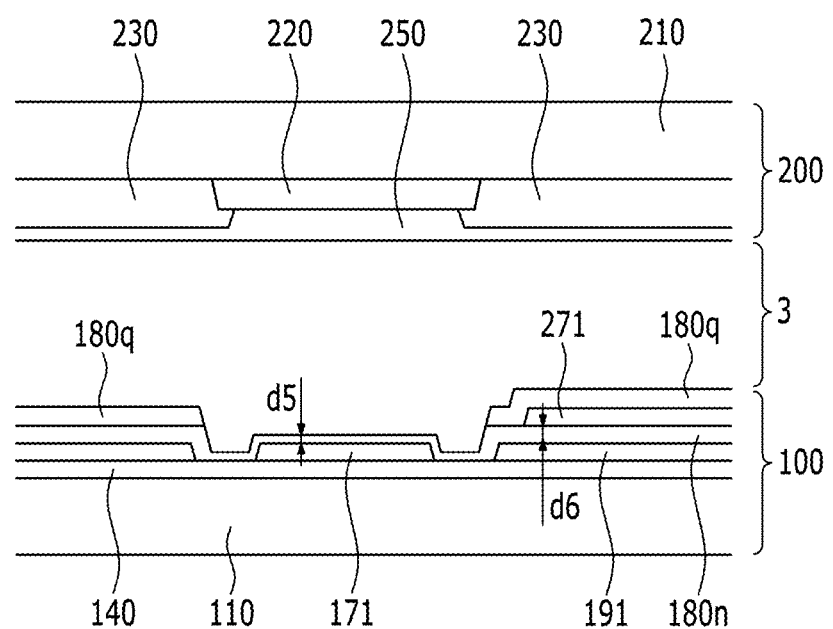
FIG. 24 is a cross-sectional view of another alternative exemplary embodiment of the liquid crystal display, corresponding to the cross-sectional view of FIG. 21.

Then, another alternative exemplary embodiment of a liquid crystal display according to the invention will be described with reference to FIG. 24. FIG. 24 is a cross-sectional view of another alternative exemplary embodiment of the liquid crystal display corresponding to the cross-sectional view of FIG. 20, and illustrates a cross-section of the region below and overlapping the vertical portion of the black matrix. Referring to FIG. 24, the liquid crystal display shown in FIG. 24 is similar to the liquid crystal display shown in FIG. 22. The same or like elements shown in FIG. 24 have been labeled with the same reference characters as used above to describe the exemplary embodiments of the liquid crystal display shown in FIG. 22, and any repetitive detailed description thereof will hereinafter be omitted or simplified.

That is, even in the exemplary embodiment, the additional insulating layer 180e exists on the exposed common electrode 270 and passivation layer 180n, and the passivation layer 180n does not exist in a region below and overlapping the black matrix 220.

However, in an exemplary embodiment of the liquid crystal display, as shown in FIG. 24, a thickness d5 of the passivation layer 180n in a region below and overlapping the black matrix is less than a thickness d6 of the passivation layer 180n in the other regions. In an exemplary embodiment, the additional insulating layer 180e is removed from a region below and overlapping the black matrix 220, and a part of the passivation layer 180 is etched, such that the thickness of the passivation layer 180n may be reduced.

A method of selectively etching the passivation layer of such an embodiment is substantially the same as the method described above.

In such an embodiment, the thickness of the passivation layer 180n in a region below and overlapping the black matrix 220 may be equal to or lower than about 50% of a thickness of other portions of the passivation layer 180n.

The thickness of the passivation layer 180n may be less in all of the region corresponding to the horizontal portion of the black matrix and the region corresponding to the vertical portion of the black matrix, or the thickness of the passivation layer 180n may be less in only one of the horizontal portion and the vertical portion of the black matrix.

Figure 25:
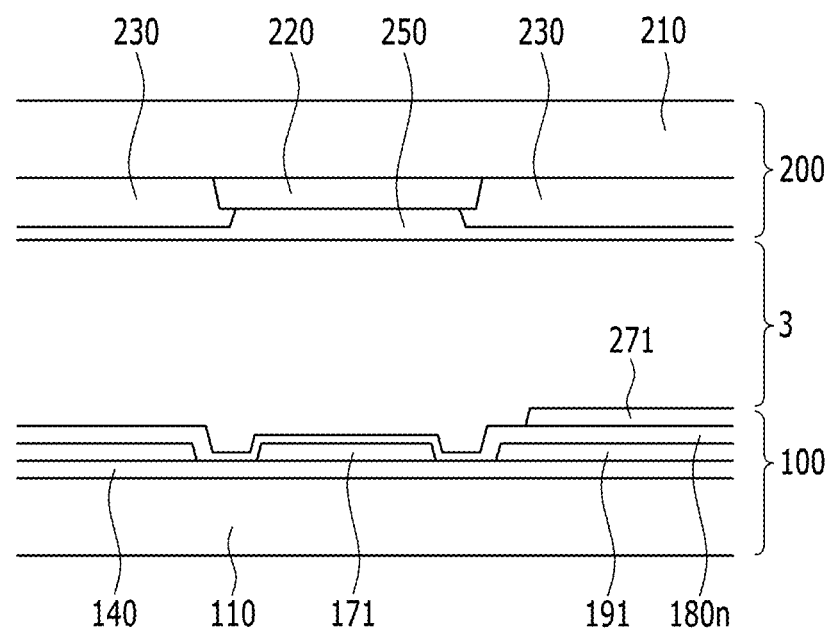
FIG. 25 is a cross-sectional view illustrating the layout view of the liquid crystal display, corresponding to the cross-sectional view of FIG. 21.

Then, another alternative exemplary embodiment of a liquid crystal display according to the invention will be described with reference to FIG. 25. FIG. 25 is a cross-sectional view illustrating the layout view of the liquid crystal display, corresponding to the cross-sectional view of FIG. 21.

Referring FIG. 25, the liquid crystal display shown in FIG. 25 is similar to the liquid crystal display shown in FIG. 24. The same or like elements shown in FIG. 25 have been labeled with the same reference characters as used above to describe the exemplary embodiments of the liquid crystal display shown in FIG. 24, and any repetitive detailed description thereof will hereinafter be omitted or simplified.

However, in an exemplary embodiment of the liquid crystal display as shown in FIG. 25, the additional insulating layer 180e is omitted. In such an embodiment, a thickness d1 of the passivation layer 180n in a region below and overlapping the black matrix 220 is less than a thickness of the passivation layer 180 in the opening portion region. The thickness difference may be provided by applying the passivation layer on the entire substrate in a process of forming the passivation layer 180n, and then selectively etching the passivation layer only in a region below and overlapping the black matrix 220. Accordingly, in such an embodiment, the thicknesses of the passivation layer in the opening portion and the light blocking portion are different from each other.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A liquid crystal display, comprising:
a first substrate;
a gate line disposed on the first substrate;
a gate insulating layer disposed on the gate line;
a semiconductor layer disposed on the gate insulating layer;
a data line disposed on the semiconductor layer;
a drain electrode disposed on the semiconductor layer;
a passivation layer which covers the data line and the drain electrode;
an organic layer disposed on the passivation layer;
a common electrode disposed on the passivation layer;
an interlayer insulating layer disposed on the common electrode;
a pixel electrode disposed on the interlayer insulating layer;
an additional insulating layer disposed on the pixel electrode;
a second substrate disposed opposite to the first substrate; and
a black matrix disposed on the second substrate, wherein the black matrix comprises:
a vertical portion which covers the data line; and
a horizontal portion which covers the gate line and the drain electrode,
wherein the additional insulating layer is disposed in an opening portion exposed through the black matrix,
an empty portion is defined through the additional insulating layer in a light blocking portion corresponding to the black matrix, and
a thickness of the interlayer insulating layer corresponding to the vertical portion of the black matrix is less than a thickness of the interlayer insulating layer in the opening portion.

2. The liquid crystal display of claim 1, wherein
an empty portion is defined through the interlayer insulating layer in a region corresponding to the vertical portion of the black matrix such that the common electrode in the region corresponding to the vertical portion of the black matrix is exposed through the additional insulating layer and the interlayer insulating layer.

3. The liquid crystal display of claim 2, wherein
a common electrode opening portion is defined through the common electrode in the region corresponding to the vertical portion of the black matrix, and
an empty portion is defined through the organic layer in the region corresponding to the vertical portion of the black matrix such that the gate insulating layer is exposed through the additional insulating layer, the interlayer insulating layer and the organic layer.

4. The liquid crystal display of claim 3, wherein
an empty portion is defined through the gate insulating layer in the region corresponding to the vertical portion of the black matrix such that the gate line is exposed through the additional insulating layer, the interlayer insulating layer, the organic layer and the gate insulating layer.

5. The liquid crystal display of claim 1, wherein
a total thickness of the interlayer insulating layer and the additional insulating layer is greater in the opening portion than in the light blocking portion.

6. A liquid crystal display, comprising:
a first substrate;
a gate line disposed on the first substrate;
a gate insulating layer disposed on the gate line;
a semiconductor layer disposed on the gate insulating layer;
a data line disposed on the semiconductor layer;
a drain electrode disposed on the semiconductor layer;
a passivation layer which covers the data line and the drain electrode;
a common electrode disposed on the passivation layer;
an interlayer insulating layer disposed on the common electrode;
a pixel electrode disposed on the interlayer insulating layer;
a second substrate disposed opposite to the first substrate; and
a black matrix disposed on the second substrate, wherein the black matrix comprises:
a vertical portion which covers the data line; and
a horizontal portion which covers the gate line and the drain electrode,
wherein
an opening portion is defined in the black matrix by the horizontal portion and the vertical portion of the black matrix, and
a thickness of the interlayer insulating layer corresponding to the vertical portion of the black matrix is less than a thickness of the interlayer insulating layer in the opening portion of the black matrix.

7. The liquid crystal display of claim 6, wherein
an empty portion is defined through the interlayer insulating layer in a region corresponding to the vertical portion of the black matrix such that the common electrode in a region corresponding to the vertical portion of the black matrix is exposed through the interlayer insulating layer.

8. The liquid crystal display of claim 7, further comprising:
an organic layer disposed on the passivation layer.

9. The liquid crystal display of claim 8, wherein
a common electrode opening portion is defined through the common electrode in the region corresponding to the vertical portion of the black matrix, and
an empty portion is defined through the organic layer in the region corresponding to the vertical portion of the black matrix such that the gate insulating layer is defined through the interlayer insulating layer and the organic layer.

10. The liquid crystal display of claim 9, wherein
an empty portion is defined through the gate insulating layer in the region corresponding to the vertical portion of the black matrix such that the gate line is exposed through the interlayer insulating layer, the organic layer the gate insulating layer.

11. The liquid crystal display of claim 6, wherein
a thickness of the interlayer insulating layer in the opening portion is greater than a thickness of the interlayer insulating layer in a light blocking portion corresponding to the black matrix.

* * * * *